United States Patent
Österling et al.

(10) Patent No.: US 11,128,322 B2
(45) Date of Patent: Sep. 21, 2021

(54) METHODS AND DEVICES FOR DETERMINATION OF BEAMFORMING INFORMATION

(71) Applicant: Telefonaktiebolaget LM Ericsson (publ), Stockholm (SE)

(72) Inventors: Jacob Österling, Järfälla (SE); Fredrik Huss, Sundbyberg (SE); Jonas B. Karlsson, Tokyo (JP); Oskar Mauritz, Johanneshov (SE); Christer Östberg, Staffanstorp (SE); Jan Roxbergh, Sollentuna (SE); Alex Stephenne, Stittsville (CA)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/111,910

(22) Filed: Dec. 4, 2020

(65) Prior Publication Data

US 2021/0091795 A1    Mar. 25, 2021

Related U.S. Application Data

(63) Continuation of application No. 16/330,447, filed as application No. PCT/SE2017/050689 on Jun. 22, 2017, now Pat. No. 10,879,941.

(Continued)

(51) Int. Cl.
*H04B 1/00* (2006.01)
*H04W 88/08* (2009.01)
(Continued)

(52) U.S. Cl.
CPC ........ *H04B 1/0003* (2013.01); *H03M 7/3068* (2013.01); *H04B 7/0617* (2013.01);
(Continued)

(58) Field of Classification Search
CPC .. H04B 7/0695; H04B 7/0617; H04B 7/0632; H04B 7/0417; H04B 7/0634;
(Continued)

(56) References Cited

U.S. PATENT DOCUMENTS

| 7,649,861 B2 | 1/2010 | Maltsev et al. |
| 8,644,368 B1 | 2/2014 | Zhang et al. |

(Continued)

FOREIGN PATENT DOCUMENTS

| CN | 102291855 A | 12/2011 |
| CN | 102299735 A | 12/2011 |

(Continued)

OTHER PUBLICATIONS

Park, Sangkyu, et al., "Large-scale Antenna Operation in Heterogeneous Cloud Radio Access Networks: A Partial Centralization Approach", IEEE Wireless Communications; vol. 22, No. 3, Jun. 1, 2015, pp. 1-9.

(Continued)

*Primary Examiner* — Khanh C Tran
(74) *Attorney, Agent, or Firm* — Murphy, Bilak & Homiller, PLLC

(57) ABSTRACT

There is presented mechanisms for providing information for determining beamforming weights or decoding user data for terminal devices. A method is performed by an RE of an access node. The RE has an interface to an REC of the access node. The method comprises obtaining information from the terminal devices to be used by the REC for determining the beamforming weights or decoding the user data. The method comprises selecting, according to a selection criterion, a part of the information to be provided to the REC in order for the REC to determine the beamforming weights or decode the user data based on the selected part of the information. The method comprises providing the (Continued)

selected part of the information to the REC over the interface.

13 Claims, 12 Drawing Sheets

Related U.S. Application Data

(60) Provisional application No. 62/383,871, filed on Sep. 6, 2016.

(51) Int. Cl.
| | |
|---|---|
| H04B 7/06 | (2006.01) |
| H03M 7/30 | (2006.01) |
| H04B 10/2575 | (2013.01) |
| H04W 88/02 | (2009.01) |

(52) U.S. Cl.
CPC ...... *H04B 10/25758* (2013.01); *H04W 88/02* (2013.01); *H04W 88/085* (2013.01)

(58) Field of Classification Search
CPC ...... H04B 7/0639; H04B 7/086; H04B 17/24; H04B 17/318; H04B 7/043; H04B 7/0619; H04B 7/0626; H04L 5/0073; H04L 25/0224; H04W 72/0426; H04W 16/28; H04W 52/42
See application file for complete search history.

(56) References Cited

U.S. PATENT DOCUMENTS

| | | | |
|---|---|---|---|
| 8,923,386 B2 | 12/2014 | Samardzija et al. | |
| 10,171,150 B1 | 1/2019 | Marupaduga et al. | |
| 2005/0105552 A1 | 5/2005 | Oesterling | |
| 2005/0107124 A1 | 5/2005 | Oesterling et al. | |
| 2007/0072646 A1 | 3/2007 | Kuwahara et al. | |
| 2009/0040918 A1 | 2/2009 | Jiang et al. | |
| 2009/0154588 A1 | 6/2009 | Chen et al. | |
| 2010/0020702 A1 | 1/2010 | Wong et al. | |
| 2010/0034093 A1 | 2/2010 | Roh | |
| 2010/0074121 A1 | 3/2010 | Sakama | |
| 2010/0075678 A1 | 3/2010 | Akman et al. | |
| 2010/0136932 A1 | 6/2010 | Osterling et al. | |
| 2010/0273498 A1 | 10/2010 | Kim et al. | |
| 2010/0284495 A1 | 11/2010 | Segal et al. | |
| 2011/0032910 A1 | 2/2011 | Aarflot et al. | |
| 2011/0105172 A1 | 5/2011 | Guo et al. | |
| 2011/0268033 A1* | 11/2011 | Boldi | H04B 7/0617 370/328 |
| 2011/0274188 A1 | 11/2011 | Sayana et al. | |
| 2011/0275376 A1* | 11/2011 | Boldi | H04B 7/026 455/436 |
| 2012/0051257 A1 | 3/2012 | Kim et al. | |
| 2012/0057548 A1 | 3/2012 | Hasegawa | |
| 2012/0300710 A1 | 11/2012 | Li et al. | |
| 2013/0157660 A1 | 6/2013 | Awad et al. | |
| 2013/0294419 A1 | 11/2013 | Heiser et al. | |
| 2014/0079018 A1 | 3/2014 | Seo et al. | |
| 2014/0119312 A1 | 5/2014 | Doetsch et al. | |
| 2014/0198684 A1 | 7/2014 | Gravely et al. | |
| 2014/0248894 A1 | 9/2014 | Kawasaki | |
| 2015/0029965 A1 | 1/2015 | Aminaka et al. | |
| 2015/0030094 A1 | 1/2015 | Zhang | |
| 2015/0071368 A1 | 3/2015 | Lau et al. | |
| 2015/0124688 A1 | 5/2015 | Xu et al. | |
| 2015/0156284 A1 | 6/2015 | Akhter et al. | |
| 2015/0303950 A1 | 10/2015 | Shattil | |
| 2016/0065388 A1 | 3/2016 | Kakishima et al. | |
| 2016/0219343 A1 | 7/2016 | Lida | |
| 2017/0222693 A1 | 8/2017 | Shen et al. | |
| 2017/0373890 A1 | 12/2017 | Fertonani et al. | |
| 2018/0026379 A1* | 1/2018 | Barker | H01Q 21/065 343/844 |
| 2018/0054214 A1 | 2/2018 | Takahashi | |
| 2018/0287696 A1 | 10/2018 | Barbieri et al. | |
| 2018/0310199 A1 | 10/2018 | Halabian et al. | |
| 2018/0317238 A1 | 11/2018 | Roxbergh et al. | |
| 2018/0323843 A1* | 11/2018 | Li | H04W 72/042 |
| 2019/0053244 A1 | 2/2019 | Mildh et al. | |
| 2019/0341985 A1* | 11/2019 | Chopra | H04B 7/0639 |
| 2020/0119790 A1* | 4/2020 | Rao | H04B 7/0617 |

FOREIGN PATENT DOCUMENTS

| | | |
|---|---|---|
| CN | 105144600 A | 12/2015 |
| EP | 0843494 A2 | 5/1998 |
| EP | 1827035 B1 | 7/2009 |
| EP | 2515590 A1 | 10/2012 |
| EP | 2515603 A2 | 10/2012 |
| EP | 2739105 A1 | 6/2014 |
| EP | 2685755 B1 | 12/2015 |
| EP | 2911331 B1 | 12/2018 |
| EP | 2785099 B1 | 5/2019 |
| TW | 201304448 A | 1/2013 |
| WO | 2014076004 A2 | 5/2014 |
| WO | 2015172277 A1 | 11/2015 |
| WO | 2015197102 A1 | 12/2015 |
| WO | 2015197104 A1 | 12/2015 |
| WO | 2016039839 A1 | 3/2016 |
| WO | 2016195555 A1 | 12/2016 |
| WO | 2016195556 A1 | 12/2016 |
| WO | 2018093301 A1 | 5/2018 |

OTHER PUBLICATIONS

Sayeed, Akbar, et al., "Beamspace MIMO for High-Dimensional Multiuser Communication at Millimeter-Wave Frequencies", 2013 IEEE Global Communications Conference (Globecom), Dec. 9, 2013, pp. 3679-3684.

"CPRI Specification V6.1", Common Public Radio Interface (CPRI); Interface Specification, Jul. 1, 2014, 129 pages.

"CPRI Specification V7.0", Common Public Radio Interface (CPRI); Interface Specification, Oct. 9, 2015, 128 pages.

"C-RAN The Road Towards Green RAN", hina Mobile White Paper, v2, 2011, China Mobile Research Institute, 2011, 48 pages.

"High level views on beam management for NR-MIMO", 3GPP TSG RAN WG1 Meeting #88, R1-1701797, ZTE, ZTE Microelectronics, Athens, Greece, Feb. 13-17, 2017, 6 pages.

De La Oliva, Antonio, et al., "An Overview of the CPRI Specification and Its Application to C-Ran-Based LTE Scenarios", Accepted from Open Call, IEEE Communications Magazine, Feb. 2016, 8 pages.

Lorca, J , et al., "Lossless Compression Technique for the Fronthaul of LTE/LTE-Advanced Cloud-RAN Architectures", 2013 IEEE 14th International Symposium on "A World of Wireless, Mobile and Multimedia Networks" (WoWMoM), Jun. 4, 2013, 9 pages.

Maiden, Richard, "Low-loss compression of CPRI baseband data", EDN Network, Sep. 17, 2014, 12 pages.

Nieman, Karl F, et al., "Time-Domain Compression of Complex-Baseband LTE Signals for Cloud Radio Access Networks", IEEE, The University of Texas at Austin, Austin, TX, 2013, 4 pages.

Park, Seok-Hwan, et al., "Robust and Efficient Distributed Compression for Cloud Radio Access Networks", IEEE Transactions on Vehicular Technology, vol. 62, No. 2, Feb. 2013, 12 pages.

Samardzija, Dragan, "Compressed Transport of Baseband Signals in Radio Access Networks", Sep. 2012, 10 pages.

* cited by examiner

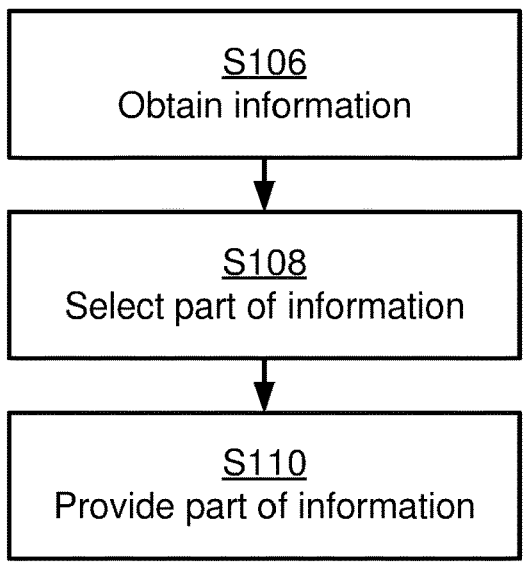
Fig. 10
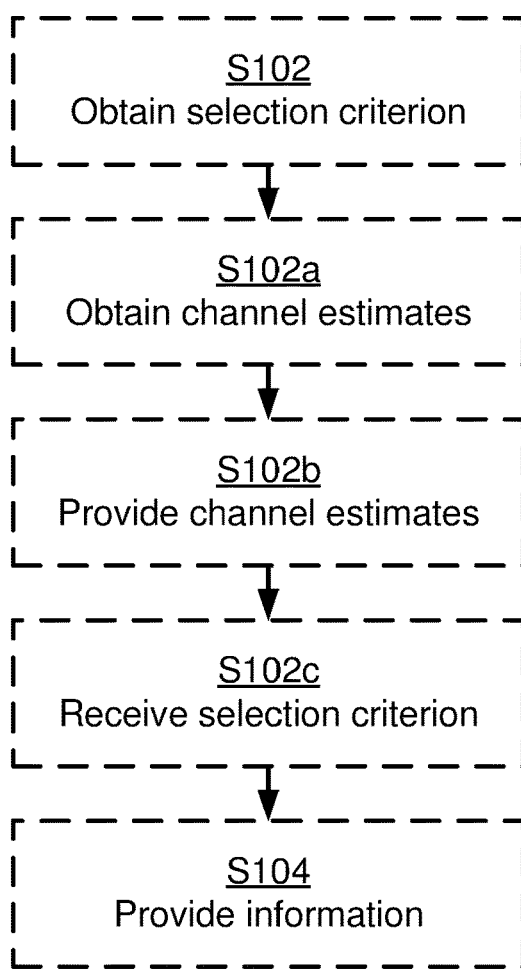
Fig. 11
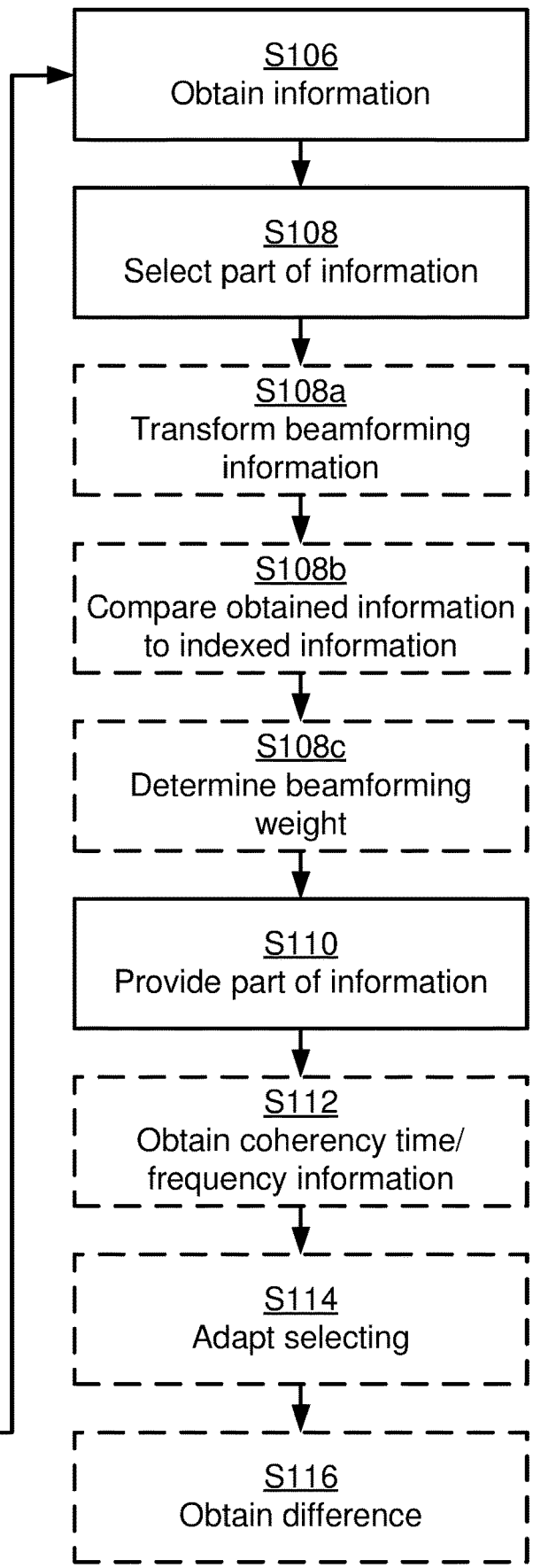

METHODS AND DEVICES FOR DETERMINATION OF BEAMFORMING INFORMATION

RELATED APPLICATIONS

This application is a continuation of U.S. application Ser. No. 16/330,447 filed 5 Mar. 2019, which is a U.S. National Phase Application of PCT/SE2017/050689 filed 22 Jun. 2017, which claims benefit of Provisional Application No. 62/383,871 filed 6 Sep. 2016. The entire contents of each aforementioned application is incorporated herein by reference.

TECHNICAL FIELD

Embodiments presented herein relate to a method, an RE, a computer program, and a computer program product for determining beamforming weights or decoding user data for terminal devices. Embodiments presented herein further relate to a method, an REC, a computer program, and a computer program product for determining beamforming weights or decoding user data for terminal devices.

BACKGROUND

In communications systems, there may be a challenge to obtain good performance and capacity for a given communications protocol, its parameters and the physical environment in which the communications system is deployed.

For example, the introduction of digital beamforming antenna systems in access nodes, such as radio base stations, etc., could allow multiple simultaneous narrow beams to be used to provide network access to, and thus server, multiple simultaneous served terminal devices, such as user equipment (UE), etc. However, the current split in the access nodes between a radio equipment controller (REC) and a radio equipment (RE) as interconnected by the Common Public Radio Interface (CPRI) may no longer be feasible as passing the data for each individual radio chain over the CPRI interface could drive prohibitively high data rates.

In more detail, the bit rate of the current CPRI interface scales directly to the number of independent radio chains in the RE. When having e.g., a 200 MHz carrier bandwidth and 128 physical antenna elements in the beamforming antenna system, a bit rate of 530 Gbps would be needed for the CPRI interface with currently used sample coding. A further potential drawback with CPRI is the extra latency from uplink (UL; from terminal device to access node) sampling to the time the data can be used in downlink (DL; from access node to terminal device), as any information needs to loop in the REC.

One way to address the above-mentioned issues is to collapse the CPRI based architecture by removing the CPRI interface and putting the functionality of the REC in the RE. This approach has at least two drawbacks. Firstly, due to faster technological development of the REC compared to the RE, the technical lifetime of the REC is assumed to be shorter than that of the RE. Replacing the RE is more costly than replacing the REC. From this aspect it could thus be beneficial to keep the functionality of the RE as simple as possible. Secondly, the REC could be configured to make decisions spanning over multiple REs in order to make coordinated multi-sector decisions, e.g. when some REs represent coverage regions of the access node within the coverage regions of other REs (e.g. a so-called micro cell within a so-called macro cell). A collapsed architecture loses this overarching coordination possibility.

Hence, there is a need for an improved communication between the REC and the RE.

SUMMARY

An object of embodiments herein is to provide efficient communication between the REC and the RE.

According to a first aspect there is presented a method for providing information for determining beamforming weights or decoding user data for terminal devices. The method is performed by an RE of an access node. The RE has an interface to an REC of the access node. The method comprises obtaining information from the terminal devices to be used by the REC for determining the beamforming weights or decoding the user data. The method comprises selecting, according to a selection criterion, a part of the information to be provided to the REC in order for the REC to determine the beamforming weights or decode the user data based on the selected part of the information. The method comprises providing the selected part of the information to the REC over the interface.

According to a second aspect there is presented an RE of an access node for determining beamforming weights or decoding user data for terminal devices. The RE has an interface to an REC of the access node and comprises processing circuitry. The processing circuitry is configured to cause the RE to obtain information from the terminal devices to be used by the REC for determining the beamforming weights or decoding the user data. The processing circuitry is configured to cause the RE to select, according to a selection criterion, a part of the information to be provided to the REC in order for the REC to determine the beamforming weights or decode the user data based on the selected part of the information. The processing circuitry is configured to cause the RE to provide the selected part of the information to the REC over the interface.

According to a third aspect there is presented an RE of an access node for determining beamforming weights or decoding user data for terminal devices. The RE has an interface to an REC of the access node and comprises processing circuitry and a computer program product. The computer program stores instructions that, when executed by the processing circuitry, causes the RE to perform operations, or steps. The operations, or steps, cause the RE to obtain information from the terminal devices to be used by the REC for determining the beamforming weights or decoding the user data. The operations, or steps, cause the RE to select, according to a selection criterion, a part of the information to be provided to the REC in order for the REC to determine the beamforming weights or decode the user data based on the selected part of the information. The operations, or steps, cause the RE to provide the selected part of the information to the REC over the interface.

According to a fourth aspect there is presented an RE of an access node for determining beamforming weights or decoding user data for terminal devices. The RE has an interface to an REC of the access node. The RE comprises an obtain module configured to obtain information from the terminal devices to be used by the REC for determining the beamforming weights or decoding the user data. The RE comprises a select module configured to select, according to a selection criterion, a part of the information to be provided to the REC in order for the REC to determine the beamforming weights or decode the user data based on the selected part of the information. The RE comprises a provide module configured to provide the selected part of the information to the REC over the interface.

According to a fifth aspect there is presented a computer program for determining beamforming weights or decoding user data for terminal devices. The computer program comprises computer program code which, when run on processing circuitry of an RE, causes the RE to perform a method according to the first aspect.

According to a sixth aspect there is presented a method for obtaining information for determining beamforming weights or decoding user data for terminal devices. The method is performed by an REC of an access node. The REC has an interface to an RE of the access node. The method comprises obtaining, over the interface, a selected part of information obtained by the RE from the terminal devices for determining the beamforming weights or decoding the user data. The selected part of the information has been selected according to a selection criterion defined for the REC to determine the beamforming weights or decode the user data based on the selected part of the information.

According to a seventh aspect there is presented an REC of an access node for determining beamforming weights or decoding user data for terminal devices. The REC has an interface to an RE of the access node and comprises processing circuitry. The processing circuitry is configured to cause the REC to obtain, over the interface, a selected part of information obtained by the RE from the terminal devices for determining the beamforming weights or decoding the user data. The selected part of the information has been selected according to a selection criterion defined for the REC to determine the beamforming weights or decode the user data based on the selected part of the information.

According to an eighth aspect there is presented an REC of an access node for determining beamforming weights or decoding user data for terminal devices. The REC has an interface to an RE of the access node and comprises processing circuitry and a computer program product. The computer program stores instructions that, when executed by the processing circuitry, causes the REC to perform operations, or steps. The operations, or steps, cause the REC to obtain, over the interface, a selected part of information obtained by the RE from the terminal devices for determining the beamforming weights or decoding the user data. The selected part of the information has been selected according to a selection criterion defined for the REC to determine the beamforming weights or decode the user data based on the selected part of the information.

According to a ninth aspect there is presented an REC of an access node for determining beamforming weights or decoding user data for terminal devices. The REC has an interface to an RE of the access node. The REC comprises an obtain module configured to obtain, over the interface, a selected part of information obtained by the RE from the terminal devices for determining the beamforming weights or decoding the user data. The selected part of the information has been selected according to a selection criterion defined for the REC to determine the beamforming weights or decode the user data based on the selected part of the information.

According to a tenth aspect there is presented a computer program for determining beamforming weights or decoding user data for terminal devices. The computer program comprises computer program code which, when run on processing circuitry of an REC, causes the REC to perform a method according to the sixth aspect.

According to an eleventh aspect there is presented a computer program product comprises a computer program according to at least one of the fifth aspect and the tenth aspect and a computer readable storage medium on which the computer program is stored. The computer readable storage medium could be a non-transitory computer readable storage medium.

Advantageously these methods, these REs, these RECs, and these computer programs allows for efficient communications between the RE and the REC when configuring resources for terminal devices.

Advantageously these methods, these REs, these RECs, and these computer programs allows for large-scale digital beamforming in the access node without significantly upgrading the data rate of the interface between the RE and the REC.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which:

FIGS. 10, 11, 12, and 13 are flowcharts of methods according to embodiments;

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 1:
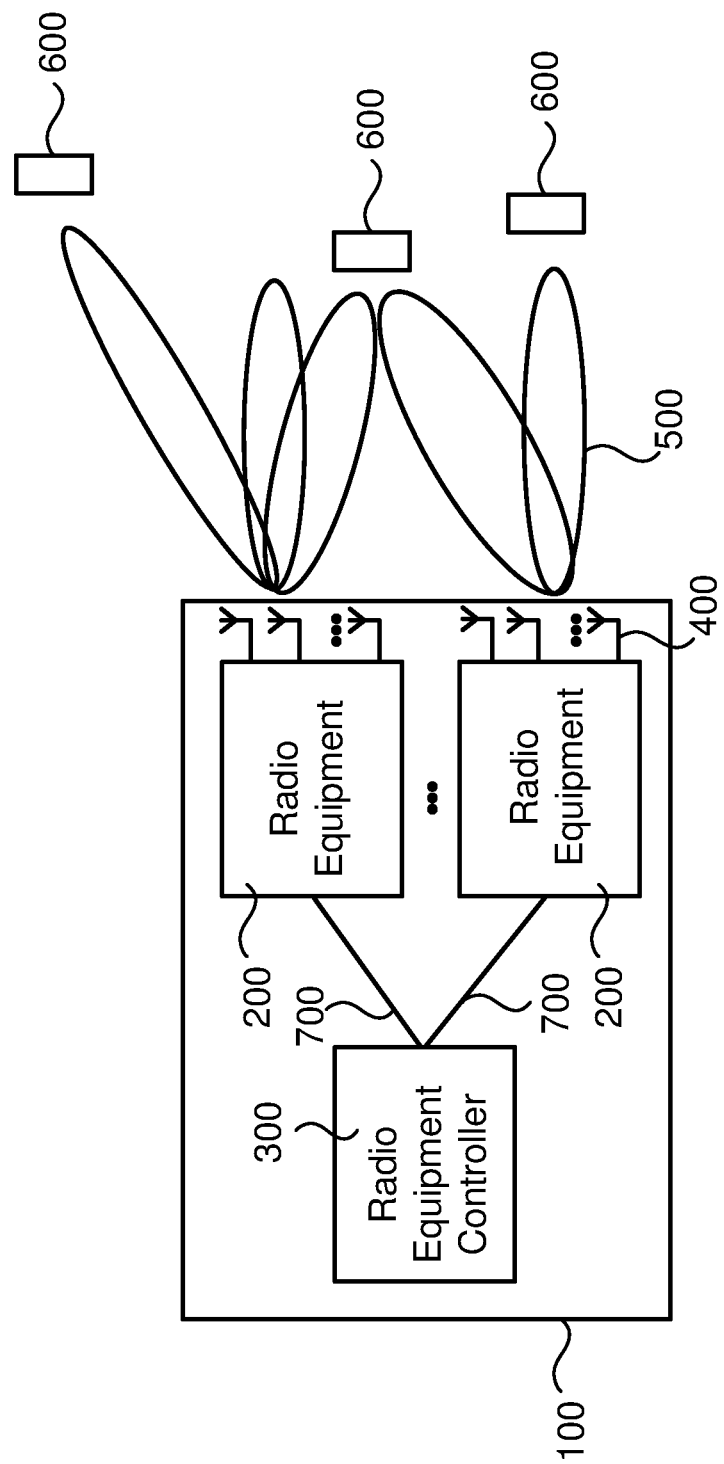
FIGS. 1, 2, 3, 4, 5, and 6 are schematic diagrams illustrating an access node according to embodiments.

FIG. 1 is a schematic diagram illustrating an access node 100 where embodiments presented herein can be applied. The access node could be a radio base station such as a radio access network node, base transceiver station, node B, evolved node B, or access point. As disclosed above, the access node comprises at least one Radio Equipment Controller (REC) 300 and at least one Radio Equipment (RE) 200. In the illustrative example of FIG. 1 the access node comprises one REC and two REs, where the REC has one interface 700 to each of the REs. The REs are configured to perform DL transmissions to, and UL receptions from, terminal devices 600 in beams 500 by using appropriate beamforming weights at the antennas 400. The beamforming weights define at least the pointing direction and the width of the beams. How to determine the beamforming weights will be disclosed below.

As defined herein the REC does not send in-phase/quadrature (I/Q) samples per physical radio branch to the RE, but rather multiple-input multiple-output (MIMO) streams, i.e., I/Q samples per layer. According to the current CPRI specification, the REC can directly address the antennas in the RE, but in the herein disclosed access node that is configured to perform beamforming, the RE performs the functionality of mapping a MIMO stream to a set of physical antenna elements in order to generate a wanted beam form. Further, in order to enable efficient simultaneous multi user beamforming, the Fast Fourier Transform (FFT) and Inverse Fast Fourier Transform (IFFT) functions are performed in the RE. In addition, the execution of the beamforming data plane functionality is added to the RE. Further, the interface 700 between REC and RE could be a packet-based interface, and hence no longer a streaming interface, sending the (frequency domain) samples to the RE symbol by symbol. This allows for quick and flexible allocation of resources on the interface to different terminal devices. The REC is configured to maintain knowledge about the terminal devices, and schedules the air interface between the access node and the terminal devices. The RE is configured to act on commands received from the REC.

As an illustrative example, consider a communications system having an air interface with a system bandwidth of 400 MHz and that provides support for 4 MIMO streams and utilizes access nodes with 64 antennas for beamforming. Using CPRI interfaces between the REC and the RE exposing all 64 antennas for the REC would require approximately 54 CPRI interfaces of 10 Gbps, since a CPRI interface carries about 480 MHz. Further, an interface using virtual antenna ports would require 4 MIMO streams of 400 MHz, and would require about 4 CPRI interfaces of 10 Gbps, since one 10 Gbps CPRI interface still carries data for about 480 MHz. By also moving the modulation DL to the RE, the 4 MIMO streams of 400 MHz would require 7 Gbps (assuming 256QAM and 20 LTE 20 MHz carriers), or one 10 Gbps CPRI interface. A higher bitrate of the CPRI interface is required in the UL if the whole system bandwidth is used, as demodulation is still performed in the REC.

Figure 2:
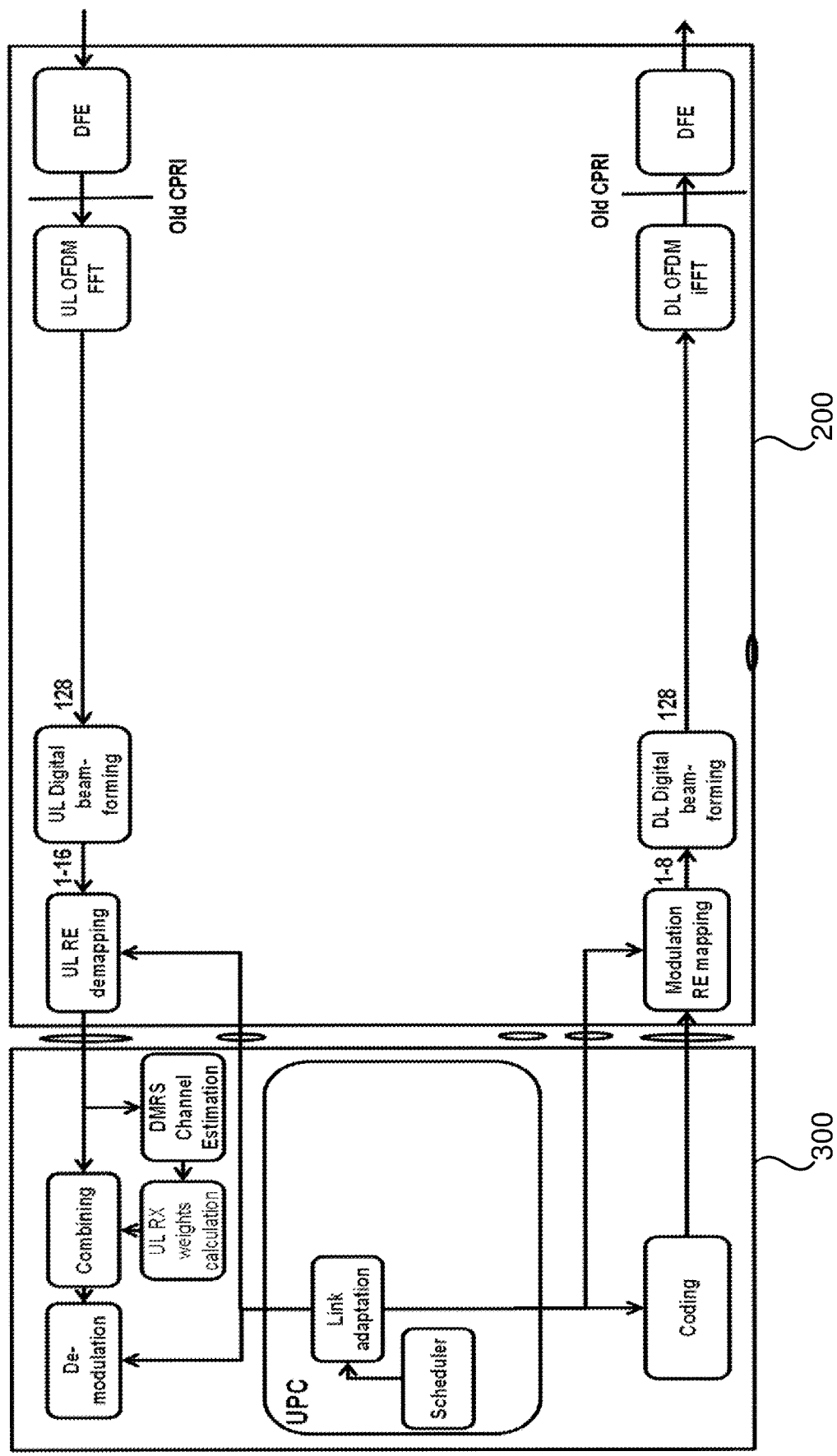

Consider the REC and RE illustrated in FIG. 2 where the REC and RE are interconnected via an interface denoted RUI, for Radio Unit Interface. In the DL direction the REC sends unmodulated bits for each terminal device. The RE modulates the data, places it on the correct subcarrier (thus performing resource mapping), applies beamforming weights (individual per radio branch) defining e.g. width and/or direction of the beams and finally convert it to time domain and transmits it to the terminal devices. FIG. 2 shows 1-8 DL MIMO layers on 128 radio branches. In the UL direction the RE samples the signals for each individual radio branch, converts it to frequency domain, applies beamforming weights, combines the signals from the different radio branches and sends a selection of the modulated combined signal to the REC for further demodulation. FIG. 2 shows 128 radio branches and 1-16 receive beams. The receive beams weakly relates to UL MIMO branches as the more MIMO branches the more receive beams are needed. Typically, more receive beams than MIMO branches are required. FIG. 2 also shows beamforming as performed before de-mapping in the RE. The two stages are interlinked as the beamforming is performed individually per terminal device. FIG. 2 further illustrates User Plane Control (UPC) with its air interface scheduling and link adaptation placed in the REC.

Figure 3:
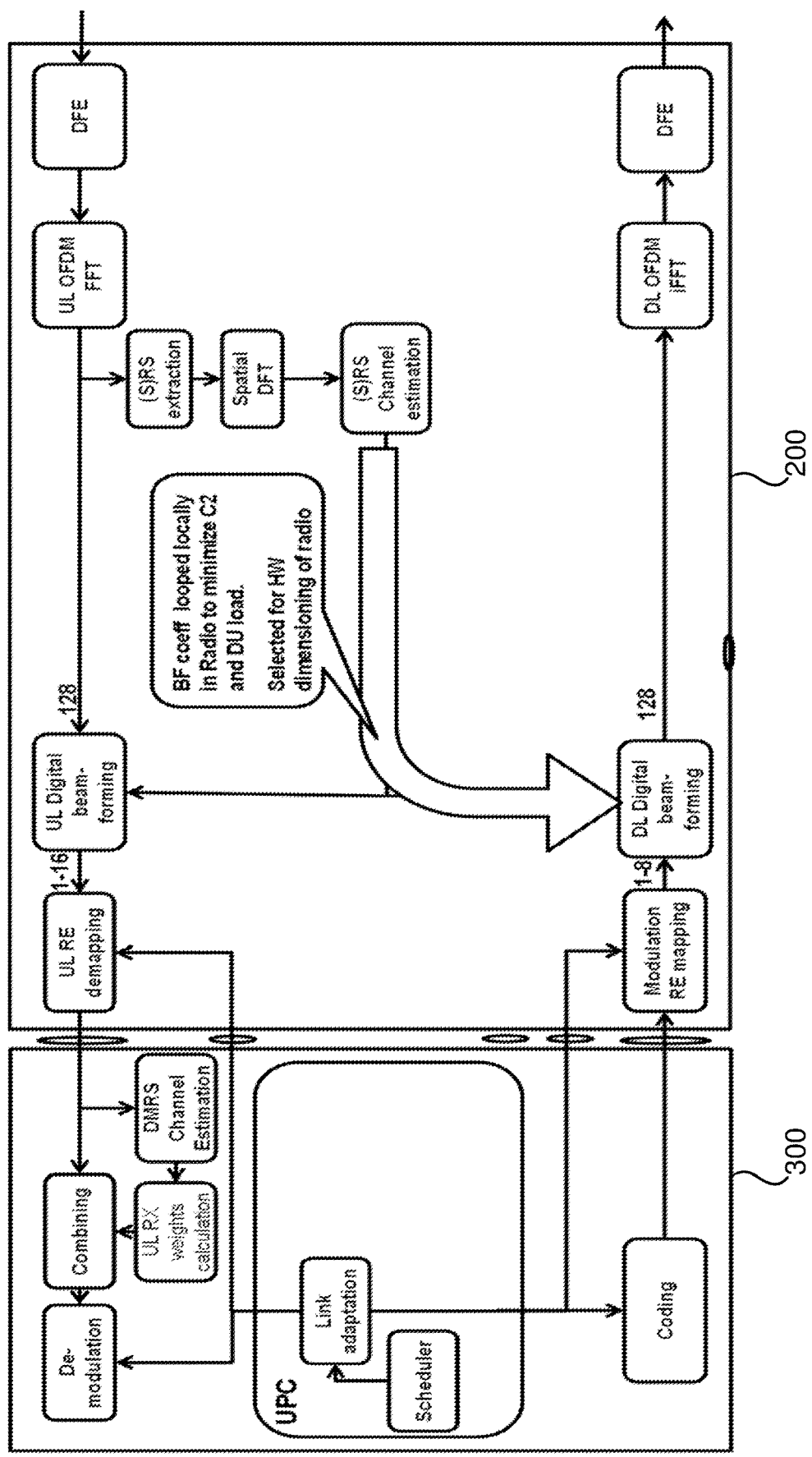

FIG. 3 shows an embodiment of an REC and an RE similar to those in FIG. 2. In FIG. 3 the RE is configured to decode reference symbols such as Sounding Reference symbols (SRS) in the UL, to store information of how the reference symbols are best received (e.g., what beamforming weights maximizes the SNR of the reference symbols) and to use this stored information when performing beamforming in the DL and UL. In FIG. 3 the RE could thus be regarded as autonomous in this respect. To accomplish this, the RU needs to maintain a storage of information identifying the best beam shapes for each terminal device, and be configured to apply that information when the corresponding terminal device is scheduled. This minimizes the communication needed over the interface between the REC and the RE with respect to beamforming, but also hides the channel for the UPC.

The scheduling and the LA are based on the dimension reduced information while further dimensions are used for the determination of beamforming weights. This is equally applicable for UL and DL. The radio channel should typically be dispersive to be able to gain from adding more dimensions to the beam calculation.

Figure 4:
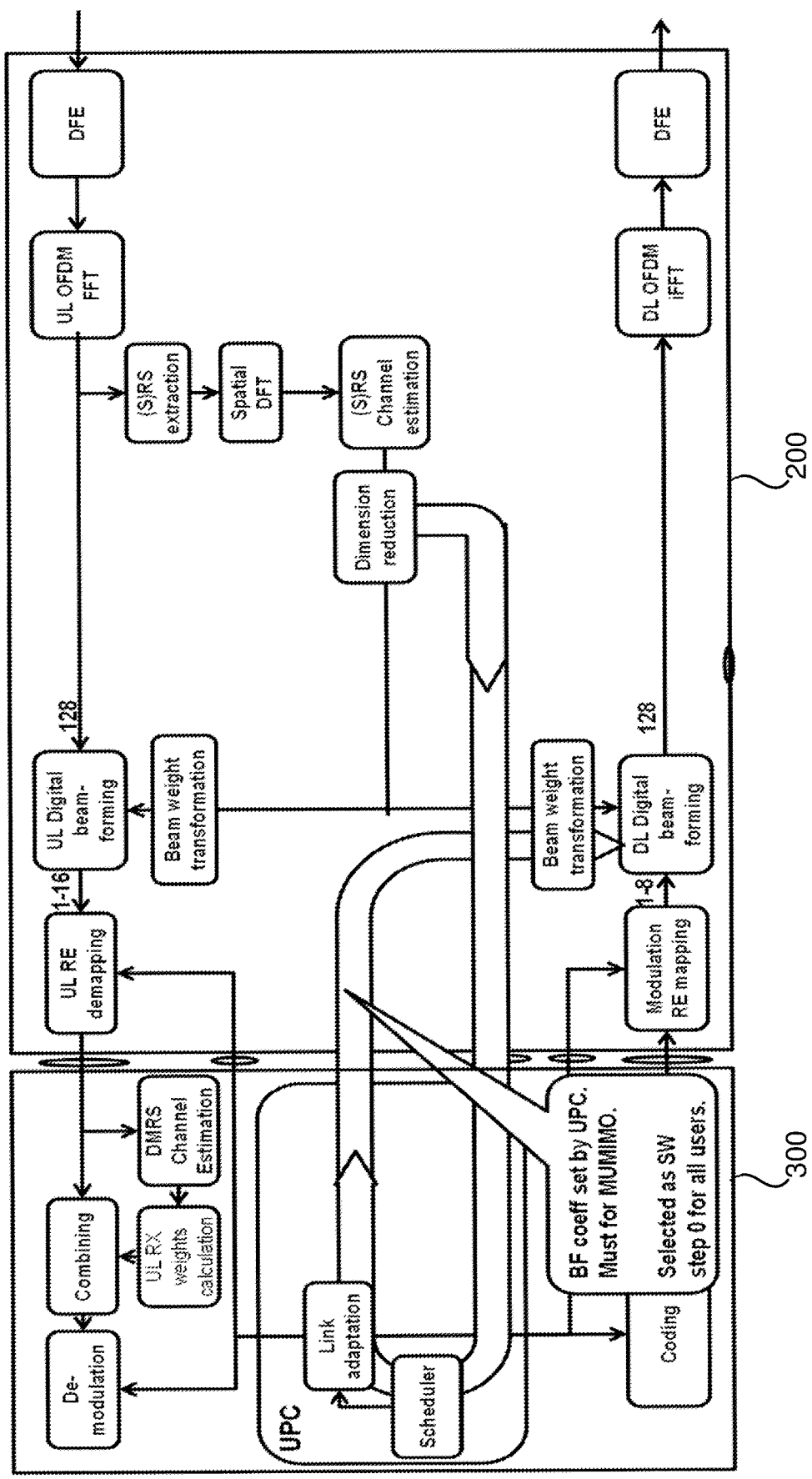

FIG. 4 shows an embodiment of an REC and an RE similar to those in FIG. 2. In FIG. 4 the beamforming control is performed primarily by the UPC in the REC. The RE still receives the reference symbols and determines information of how the reference symbols are best received. This information is then sent to the REC. The REC uses this information to make an optimal decision on MIMO streams, link adaptation and coordinated scheduling with other terminal devices, such as MU-MIMO or nulling.

To make the communication and functionality performed in the UPC generic and not heavy dependent on the actual implementation of the RE (e.g., in terms of number of branches, antenna layout, etc.) or operating mode (e.g., power save, faulty branches, etc.), the communications between the REC and the RE regarding beamforming properties is expressed in beam direction space rather than antenna element space. That is, instead of presenting a beam as a set of weights of physical antenna elements the beam is presented as a combination of a set of predetermined beams. This also allows for a more compressed format for this communication, thus saving bit rate on the interface between the REC and the RE. For instance, a linear combination of 3 predetermined beams could be expressed as 3 times 24 bits (an 8-bit beam number+an 8-bit amplitude+an 8-bit phase) rather than 128 times 16 bits (an 8-bit amplitude+an 8-bit phase for each of the 128 physical antenna elements). The transformation from the physical antenna element space to the beam direction space is performed by a Dimensions Reduction entity, and the inverse transformation is performed by a Beam Weight Transformation entity.

The operations as performed by the REC and RE in FIG. 4 could be preferred when the load of the access node is comparatively high and UPC needs to determine the channel state for the best decision on link adaptation.

The operations as performed by the REC and RE in FIG. 4 could be preferred when MU-MIMO or nulling is used, as the UPC then needs channel state information for the LA of the combination, and to determine which users are suitable for simultaneous scheduling, so called MU-MIMO scheduling. Note that nulling may also be applied between terminal devices served by different REs, and is therefore impossible to perform within one autonomous RE (as in FIG. 3).

Figure 5:
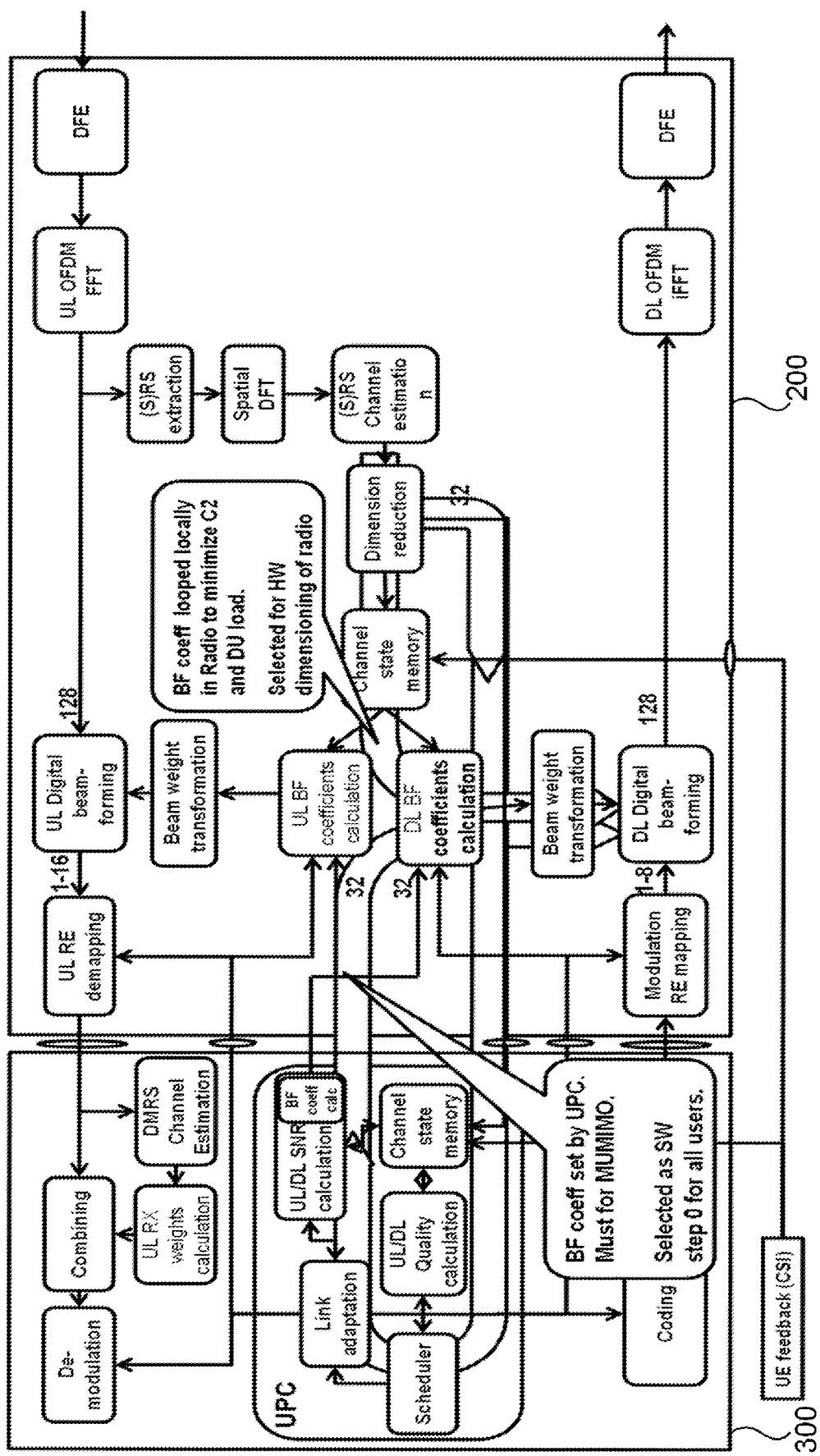

FIG. 5 illustrates an embodiment of an REC and an RE combining the functionality of the REC and RE in the embodiments of FIG. 3 and FIG. 4. In comparison to FIG. 3 and FIG. 4, the embodiment of FIG. 5 comprises a channel state memory, an UL/DL BF coefficient calculation entity (where BF is short for beamforming), an UL/DL quality calculation entity, an UL/DL SNR calculation entity (where SNR is short for signal to noise ratio), and a CSI feedback function (where CSI is short for Channel State Information).

The channel state memory is configured to store reference symbols since the reference symbols are not sent continuously. The transmission rate of the reference symbols is controlled by the access node, and different terminal devices could have different transmission rates of the reference symbols to allow for the access node to follow channel state changes. Although the channel state memory is illustrated as storing data expressed in the beam space in both the RE and the REC, the RE could instead have the channel state memory storing data expressed in the physical antenna element space.

The UL/DL BF coefficient calculation entity is configured to determine beamforming weights based on the channel state memory and possible other constraints (such as nulling and MU-MIMO) in the RE The UL RX weights calculation entity (where RX is short for reception) is configured to determine beamforming weights for the uplink. The UL beamforming weight determination can be part of maximum-ratio combining (MRC) in the UL demodulator/equalizer. The UPC will order more beams than layers, and then the demodulation will combine these to improve SNR or suppress interferers. In the REC, the determination of beamforming weights could be performed in conjunction with the link adaptation whereas in the case of beamforming weights determined by the RE, the link adaptation is done independently.

The UL/DL quality calculation entity is configured to determine a quality estimate in respect of each terminal device subject to MU-MIMO scheduling. This quality estimate should reflect the spatial separation between wireless terminals as well as the quality achieved when co-scheduling wireless terminals on the same time/frequency resource. The quality estimate is based on the information in the channel state memory.

The UL/DL SNR calculation entity is configured to determine the beamforming weights for each terminal device, and to provide the link adaptation function with estimates of the resulting SNR for each of the terminal devices being scheduled, including the mutual effect of co-scheduled terminal devices, so called MU-MIMO scheduling. The UE feedback (CSI) entity is configured to extract information about the channel provided by the terminal devices (in the UL data plane). Especially, in the case of FDD, where the reciprocity of the DL and UL of the channel to the terminal device is not perfect, it can be beneficial for the terminal device to send measurements (e.g., CSI) on the DL signal back to the access node. The CSI reports are extracted by the REC and used in the channel state memory and thus being considered in the determination of the beamforming weights.

In configurations where the bitrate of the interface between the REC and the RE is low (such as below a threshold), the determination of beamforming weights is executed by the RE (as in FIG. 3), otherwise the determination is executed by the REC (as in FIG. 4). That is, in case of limited available capacity of the interface between the REC and the RE, the REC (such as in the UPC) determines that the determination of beamforming weights is to be executed by the RE. Cell performance of the access node could be maximized by determining the beamforming weights in the REC for all co-scheduled terminal devices (within the same time and frequency domain) in order to accomplish best link adaptation and orthogonality. This requires that the RE sends extra information to the REC to allow for such determination, and that the REC sends the determined beamforming weights to the RE.

Still further, although the REC sends the determined beamforming weights to the RE, the RE can determine beamforming weights in parallel and thus combine these internally determined beamforming weights with the beamforming weights received from the REC. For access nodes where the interface between the REC and the RE is constrained but not minimized, the dual loops (as defined by the embodiment in FIG. 5) allow for the access node to select some terminal devices which can be handled locally in the RE, thereby making bitrate of the interface between the REC and the RE available to handle terminal devices which are eligible to MU-MIMO scheduling, e.g. terminal devices using a streaming service.

Having both loops also allows for efficient beamforming coefficient compression. If a terminal device is note exposed to constraints from the UPC, the beamforming coefficient calculation in the REC will be the same as performed in the RE, and the REC can send a minimal message requesting the RE to use its locally calculated values. In case of heavy dimensioning reduction, this may even improve the beamforming gain as the RE has uncompressed channel estimation data. Correspondingly, if constraints have changed any beamforming weights, it can be evaluated if the constraints have less bits than the new beamforming weights, and can be transferred instead.

Figure 6:
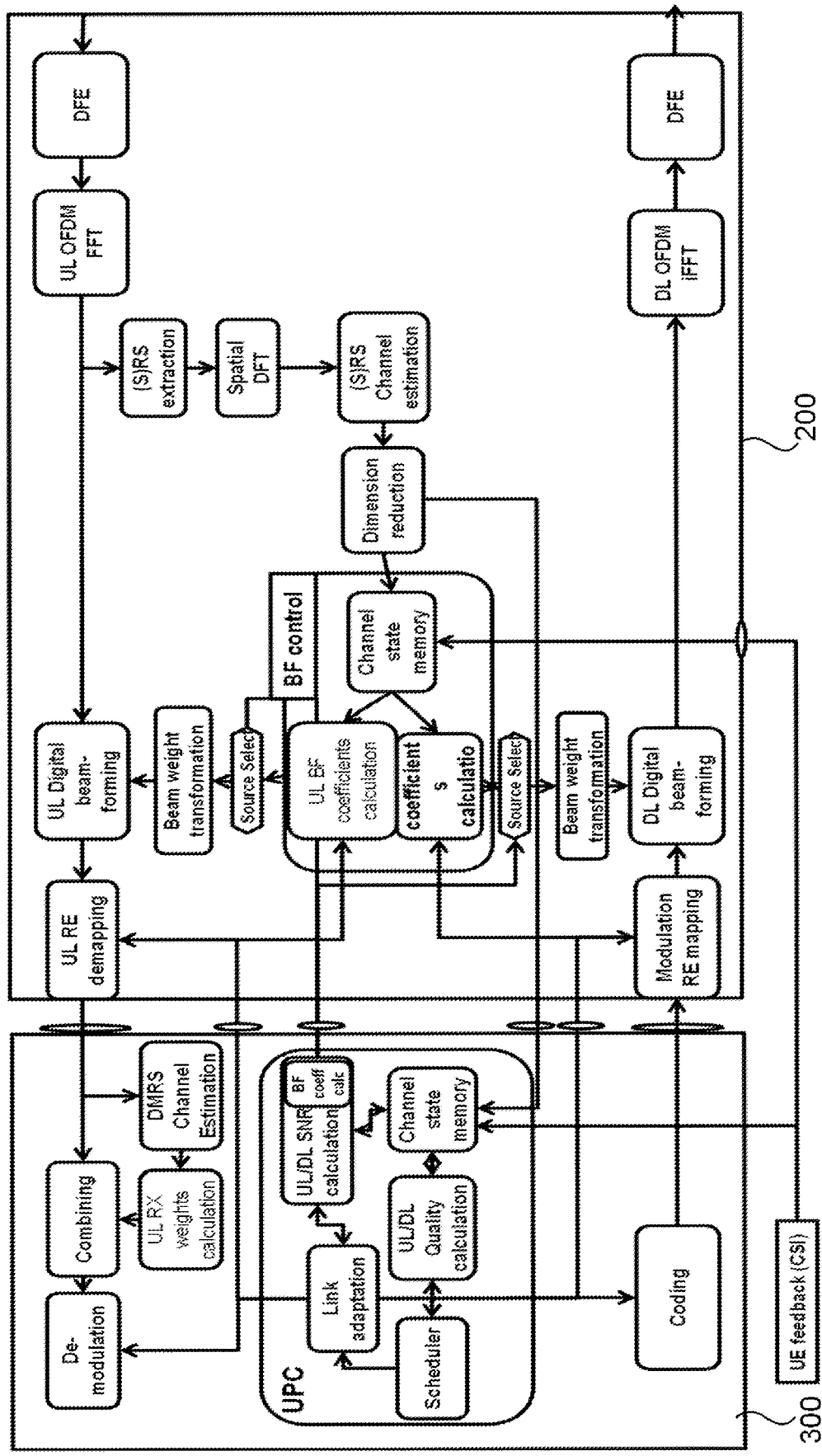

Further aspects applicable to both the embodiments of the RE and the REC will now be disclosed with reference to the embodiment of REC and RE illustrated in FIG. 6. The description of those entities already having been described with reference to any of FIGS. 2-5 is omitted for brevity.

A reference symbol extraction entity is configured to extract the reference symbols from the Resource Elements that are provided by the UL OFDM FFT from all antenna ports.

The spatial DFT entity and the channel estimation entity are configured to collectively provide a quality value for the fixed beam directions. The quality value is typically based on a filtering of the reference symbols per involved transmission antennas at the terminal device or MIMO layer within the resource block or for a filtering of a further processed channel estimate per involved transmission antennas at the terminal device or MIMO layer and extracted reference symbols. The beam direction space is provided by processing the reference symbols from all antennas through the spatial DFT entity.

A Dimension Reduction entity is configured to reduce dimension of data being inputted to the Dimension Reduction entity. For beamforming weight determination performed via the REC, the dimension of which fixed beam directions to use for the beamforming is reduced in order to limit the processing load when calculating the weights and the interface rate from the RE to the REC. The dimension reduction is based on the quality values from the Spatial DFT entity and the channel estimation entity. For beamforming weight determination performed internally in the RE, more dimensions can be stored, and thus providing better SNR in case of SU-MIMO transmission.

A Channel state memory is provided in the REC when beamforming weight determination is performed via the REC. For the terminal devices that are scheduled to be measured, the reference symbol based channel estimates can be sent to the REC and stored in the REC Channel State Memory. These stored channel estimates can then be used for link adaption as well as determination of beamforming weights. The content of the Channel state memory can be used when the data channel is active and is updated for every new measurement of reference symbols. In addition to this the Channel state memory can also store a covariance matrix for all beam directions that have been measured. Those values can be calculated in the REC. If no MU-MIMO pairing shall be done the beam direction related information does not need to be stored in the Channel state memory, which will lower the demand on the interface between the REC and the RE.

A Channel state memory is provided in the RE when beamforming weight determination is performed internally in the RE. For the reference symbols of the terminal devices that are scheduled to be measured, the reference symbol based Channel estimates are stored in the RE Channel State Memory. These stored channel estimates can be used for determining beamforming weights. The content of the Channel state memory can be used when the data channel is active and could be updated for every new measurement of reference symbols. If no MU-MIMO pairing is done, if no beam direction related information is stored in the REC based channel state memory, and if the covariance matrix will be used, the same covariance matrix as described in the channel state memory in the REC can instead be stored in the channel state memory in the RE.

A Source Select entity is configured to select and/or combine the beamforming weights that either originate from the REC or locally from the RE. Even in the case where the channel estimate is sent to the REC, a local copy of the channel estimate can be stored in the RE. In case the REC will not send beamforming weights, the RE will have to use beamforming weights as determined internally. This can be due to the REC being satisfied with the beamforming weights determined internally or that the beamforming weights are not received properly by the RE (e.g., due to a lost message). Further, as will be further disclosed below the local stored channel estimates can be used to calculate a default setting of the beamforming weights to which the REC sends differential information, see the compression chapter below. The RE can signal to the REC if it has stored a local copy of the channel estimate. This allows the REC to know if such compression is possible. The RE can run out of local memory, thus such a signalling is recommended (but not mandated). Also, the REC can explicitly order the RE to store a local copy. Also in case no complete channel estimate is sent to the REC, a reduced channel estimate could be transmitted from the RE to the REC to aid the link adaptation and rank selection.

Figure 7:
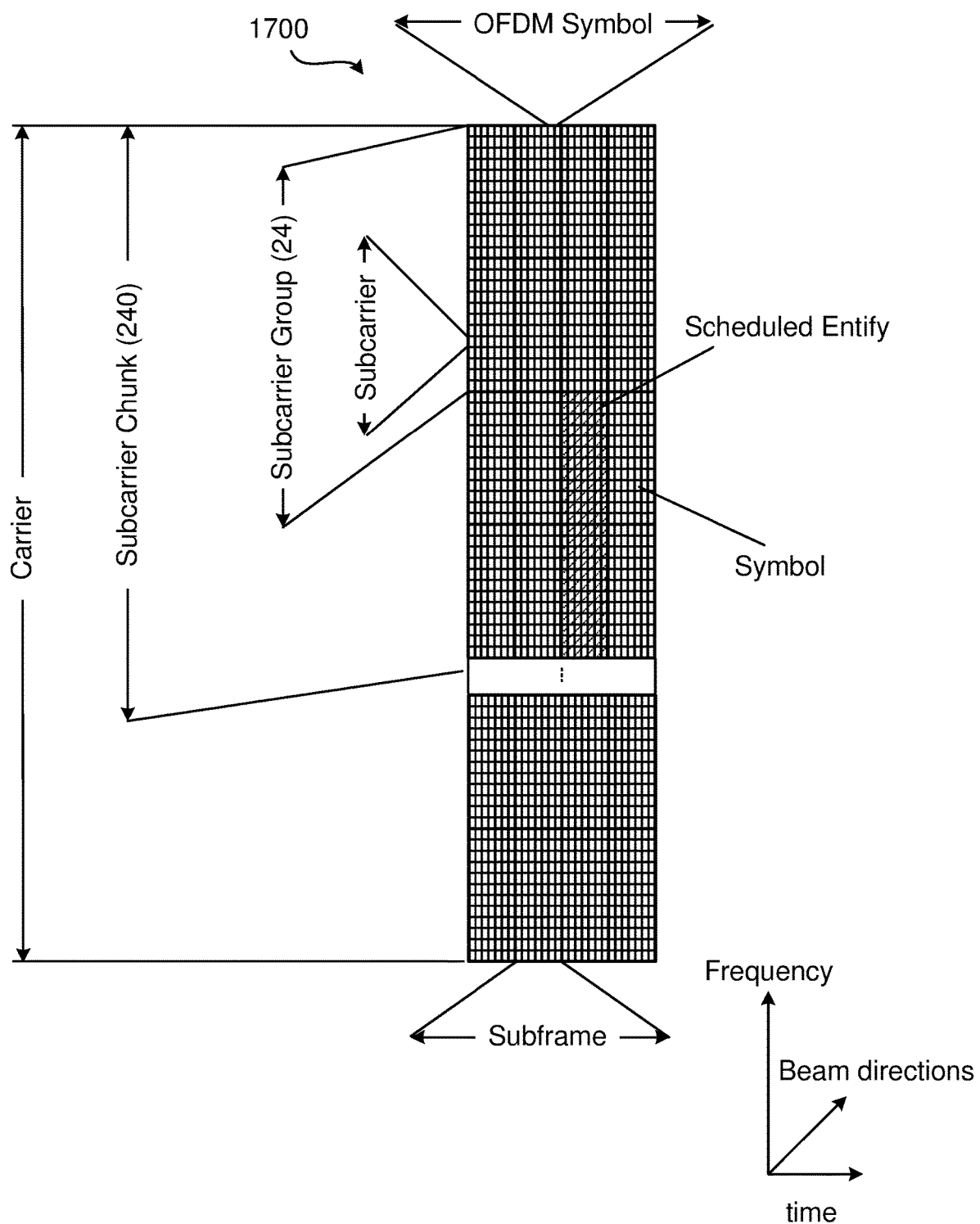
FIG. 7 is a schematic illustration of a time-frequency resource grid according to embodiments.

FIG. 7 gives an example of a time-frequency resource grid 1700 applicable to embodiments disclosed herein. The time-frequency resource grid illustrates a possible allocation of resources to terminal devices in terms of a scheduled entity comprising symbols, where each symbol corresponds to a Resource Element. Each Resource Element in time corresponds to one orthogonal frequency-division multiplexing (OFDM) symbol and in frequency corresponds to a subcarrier. One subframe comprises 7 symbols; one subcarrier group comprises 24 subcarriers, one subcarrier chunk comprises 10 subcarrier groups; and one carrier comprises at least one subcarrier chunk.

According to some aspects there are provided mechanisms for efficient dimensions reduction for expressing beamforming weights and information related to determining the beamforming weights.

According to some aspects there are provided mechanisms for efficient compression of beamforming weights.

According to some aspects there are provided mechanisms for efficient selection of UL beams.

The embodiments disclosed herein thus relate to mechanisms for determining beamforming weights or decoding user data for terminal devices and determining beamforming weights or decoding user data for terminal devices. In order to obtain such mechanisms there is provided an RE, a method performed by the RE, a computer program product comprising code, for example in the form of a computer program, that when run on processing circuitry of the RE, causes the RE to perform the method. In order to obtain such mechanisms there is further provided an REC, a method performed by the REC, and a computer program product comprising code, for example in the form of a computer program, that when run on processing circuitry of the REC, causes the REC to perform the method.

Figures 12, 13:
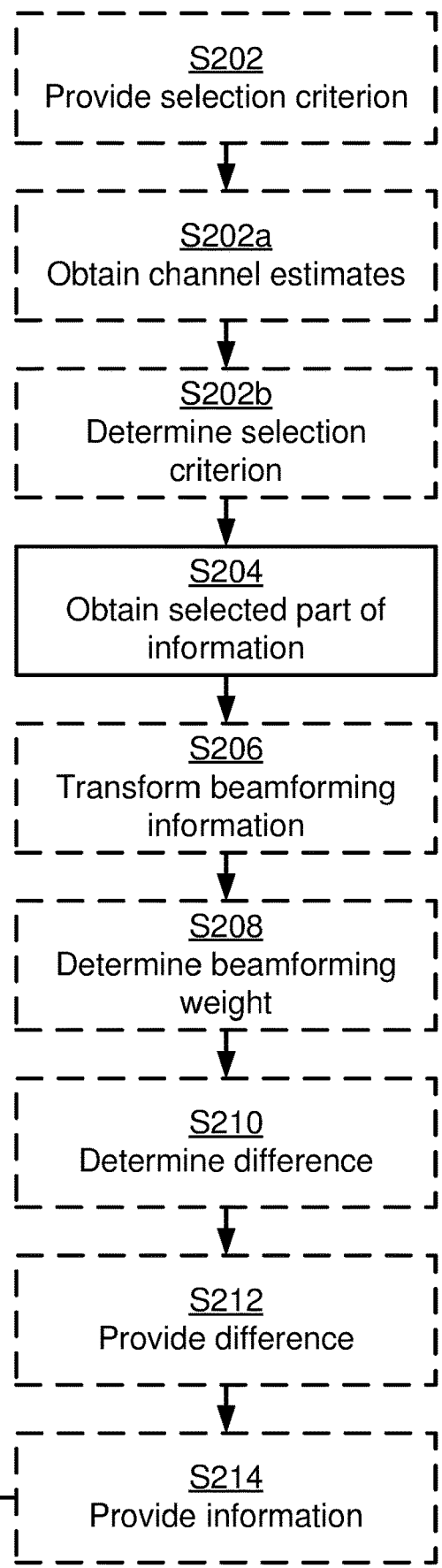

FIGS. 10 and 11 are flow charts illustrating embodiments of methods for determining beamforming weights or decoding user data for terminal devices as performed by the RE. FIGS. 12 and 13 are flow charts illustrating embodiments of methods for determining beamforming weights or decoding user data for terminal devices as performed by the REC. The methods are advantageously provided as computer programs 1820a, 1820b.

Reference is now made to FIG. 10 illustrating a method for determining beamforming weights or decoding user data for terminal devices as performed by the RE of the access node according to an embodiment. As disclosed above the RE has an interface to the REC of the access node.

S106: The RE obtains information from the terminal devices to be used by the REC for determining the beamforming weights or decoding the user data.

S108: The RE selects, according to a selection criterion, a part of the information to be provided to the REC in order for the REC to determine the beamforming weights or decode the user data based on the selected part of the information.

S110: The RE provides the selected part of the information to the REC over the interface.

Embodiments relating to further details of determining beamforming weights or decoding user data for terminal devices as performed by the RE will now be disclosed.

Reference is now made to FIG. 11 illustrating methods for determining beamforming weights or decoding user data for terminal devices as performed by the RE according to further embodiments. It is assumed that steps S106, S108, S110 are performed as described above with reference to FIG. 10 and a thus repeated description thereof is therefore omitted.

There could be different ways for the RE to obtain the selection criterion. According to an embodiment the selection criterion is obtained from the REC, as in step S102:

S102: The RE obtains the selection criterion from the REC over the interface.

Channel estimates can by the REC be used to specify the selection criterion (e.g., defining which user data the REC needs for decoding of the same). Hence according to an embodiment the information is defined by reference signals, and the RE is configured to perform steps S102a, S102b, S102c:

S102a: The RE obtains channel estimates for the terminal devices.

S102b: The RE provides the channel estimates to the REC over the interface.

S102c: The RE receives the selection criterion from the REC over the interface, wherein the selection criterion is based on the channel estimates.

According to some aspects the selected part of the information has reduced dimensionality in comparison to the obtained information. Hence, according to an embodiment the obtained information is associated with a first dimensionality, and wherein the selected part of the information is associated with a second dimensionality being smaller than the first dimensionality.

According to some aspects the selected part of the information is obtained by transforming the obtained information. On examples of such a transformation is a transformation from antenna space to direction space. Here, direction space is to be interpreted as any space being expressed as a combination of directions. Hence, according to an embodiment the obtained information represents beamforming information per antenna and wherein the RE is configured to perform step S108a as part of the above disclosed selecting step:

S108a: The RE transforms the beamforming information per antenna to beamforming information per direction, wherein the selected part of the information represents the beamforming information per direction.

Quantization can be performed in the direction space. Hence, according to an embodiment only the beamforming information per direction having a signal quality measure above a threshold are selected to be represented in the selected part of the information. Examples of a signal quality measure are SNR and SNIR.

According to some aspects identical information provided for consecutive time/frequency resources. Hence, according to an embodiment the obtained information represents information defined per time/frequency resource, and the selected part of the information represents information defined per at least two consecutive time/frequency resources.

According to an embodiment the selected part of the information represents differential information in relation to the obtained information. In this respect, the differential information is defined by the relation between two consecutive resources in either time or frequency.

According to an embodiment the RE adaptively changes the time- and/or frequency resolution of the information depending on the coherency time and frequency coherency bandwidth. Hence, according to an embodiment the RE is configured to perform steps S112, S114:

S112: The RE obtains a coherency time and frequency coherency bandwidth of a radio channel over which the information from the terminal devices is obtained.

S114: The RE adapts the selecting depending on the coherency time and frequency coherency bandwidth.

According to some aspects the RE is configured to cache information with appropriate indexing and referencing scheme and to send the index of a closest cached candidate (possibly together with a quantized differential coded residual vector with a small bit width). Hence, according to an embodiment the RE is configured to perform step S108b:

S108b: The RE compares the obtained information to indexed reference information, and the selected part of the information is defined by an index of the reference information having minimum distance to the obtained information.

According to an embodiment the selected information is provided as successive refinements of the obtained information.

According to an embodiment the obtained information represents beamforming information and the RE is configured to perform steps S108c and S116:

S108c: The RE determines a beamforming weight based on the beamforming information, wherein the selected part of the information represents the beamforming weight determined by the RE.

S116: The RE obtains, over the interface, a difference between the beamforming weight and a beamforming weight determined by the REC having used the selected part of the information.

According to some aspects the RE dynamically selects a subset of the beams in the direction space. Hence according to an embodiment the selected part of the information represents only a subset of the beamforming information per direction.

According to some aspects the selection of subset of beams is based on signal quality measurements using sounding reference signals or demodulation reference signals as input. Hence according to an embodiment the subset of the beamforming information per direction is determined based on a signal quality measure of signals received from the terminal devices.

According to some aspects the set of beams is constructed as fixed beams (such as based on a DFT). Hence according to an embodiment the transforming of the beamforming information per antenna to beamforming information per direction is based on beams in a set of fixed directions.

According to some aspects the set of beams is constructed as dynamic beams based on the received signals from the UEs (such as based on a singular value decomposition (SVD) transform). Hence according to an embodiment the transforming of the beamforming information per antenna to beamforming information per direction is based on beams in which signals from the terminal devices are received.

According to some aspects the RE signals over the interface to the REC the maximum number of beams in total that the RE is capable to select. Hence, according to an embodiment the obtained information represents beamforming information and the RE is configured to perform step S104:

S104: The RE provides, over the interface, the REC with information about how many beams the RE is capable of selecting.

According to some aspects the RE transfers beams that are selected for multiple UEs only once for UEs that are allocated to the same REC. Hence, according to an embodiment the obtained information represents beamforming information for at least two terminal devices, and the part of the information represents a union of the beamforming information for the at least two terminal devices.

Reference is now made to FIG. 12 illustrating a method for determining beamforming weights or decoding user data for terminal devices as performed by the REC of the access node according to an embodiment. As disclosed above the REC has an interface to an RE of the access node.

S204: The REC obtains, over the interface, a selected part of information obtained by the RE from the terminal devices for determining the beamforming weights or decoding the user data. The selected part of the information has been selected according to a selection criterion defined for the REC to determine the beamforming weights or decode the user data based on the selected part of the information.

Embodiments relating to further details of determining beamforming weights or decoding user data for terminal devices as performed by the REC will now be disclosed.

Reference is now made to FIG. 13 illustrating methods for determining beamforming weights or decoding user data for terminal devices as performed by the REC according to further embodiments. It is assumed that step S204 is performed as described above with reference to FIG. 12 and a thus repeated description thereof is therefore omitted.

As disclosed above, according to an embodiment the RE obtains the selection criterion from the REC over the interface. Hence, according to an embodiment the REC is configured to perform step S202:

S202: The REC provides the selection criterion to the RE over the interface.

As disclosed above, channel estimates can by the REC be used to specify the selection criterion. Hence, according to an embodiment the selected part of information is for decoding user data and the REC is configured to perform steps S202a and S202b:

S202a: The REC obtains channel estimates from the REC.

S202b: The REC determines the selection criterion based on the channel estimates.

As disclosed above, according to some aspects the selected part of the information is obtained by transforming the obtained information. Hence according to an embodiment the obtained information represents beamforming information per antenna, wherein the selected part of the information represents beamforming information per direction, and the REC is configured to performs step S206:

S206: The REC transforms the beamforming information per direction to beamforming information per antenna.

According to an embodiment the obtained information represents beamforming information, the selected part of the information represents a beamforming weight determined by the RE, and the REC is configured to perform steps S208, S210, and S212:

S208: The REC determines a beamforming weight using auxiliary information.

S210: The REC determines a difference between the beamforming weight determined by the RE and the beamforming weight determined by the REC over the interface.

S212: The REC provides the RE with the difference over the interface.

According to some aspects the REC signals over the interface to the RE the maximum number of beams in total that the RE is allowed to select. Hence, according to an embodiment the obtained information represents beamforming information and the REC is configured to perform step S214:

S214: The REC provides, over the interface, the RE with information about how many beams the RE is allowed to select in total.

According to some aspects the REC signals over the interface to the RE the maximum number of beams per UE that the RE is allowed to select. Hence, according to an embodiment the obtained information represents beamforming information and the REC is configured to perform step S216:

S216: The REC provides providing, over the interface, the RE with information about how many beams the RE is allowed to select per terminal device.

A method for obtaining information for determining beamforming weights for terminal devices as performed by the RE will now be disclosed.

S302: The RE obtains beamforming information per direction from the REC over the interface.

S304: The RE transforms the beamforming information per direction to beamforming information per antenna, the beamforming information per antenna representing the beamforming weights.

S306: The RE applies the beamforming weights.

A method for providing information for determining beamforming weights for terminal devices as performed by the REC will now be disclosed.

S402: The REC obtains beamforming information per antenna, the beamforming information per antenna representing the beamforming weights.

S404: The REC transforms the beamforming information per antenna to beamforming information per direction.

S406: The REC provides the beamforming information per direction to the RE over the interface.

A method for providing information for determining beamforming weights for terminal devices as performed by the RE will now be disclosed.

S502: The RE obtains beamforming information per antenna from at least one of the terminal devices, the beamforming information per antenna representing the beamforming weights.

S504: The RE transforms the beamforming information per antenna to beamforming information per direction.

S506: The RE provides the beamforming information per direction to the REC over the interface.

A method for obtaining information for determining beamforming weights for terminal devices as performed by the REC will now be disclosed.

S602: The REC obtains beamforming information per direction from the RE.

S604: The REC determines the beamforming weights per direction based on the beamforming information per direction.

S606: The REC provides the beamforming weights per direction to the RE over the interface.

Particular aspects of efficient dimensions reduction of the beamforming weights when communicating information of the beamforming weights between the REC and the RE will now be disclosed in more detail.

Figure 8:
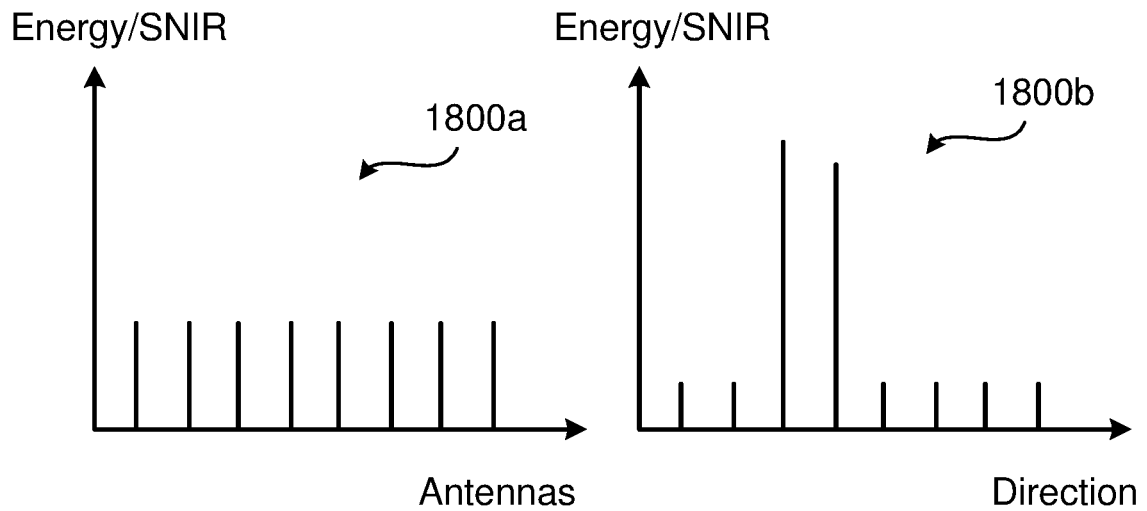
FIG. 8 is a schematic illustration comparing energy in antenna space and direction space.

The energy or Signal-to-Noise and Interference Ratio (SNIR) of the signals is approximately the same for all the individual antennas. However, since the received UL signals (or transmitted DL signals) are associated with pointing directions due to the beamforming weights, the energy or SNIR will be unevenly distributed between different pointing directions. This is illustrated in FIG. 8. At 1800a is illustrated energy per antenna and at 1800b is illustrated energy per direction. The energy or SNIR will be high in pointing directions from the access node to the terminal devices and low in other directions.

If the majority of the energy is located in a subset of all possible pointing directions, and signals in other directions contains mostly noise, it is possible to reduce the dimensionality of the signals to process by only selecting the directions with significant energy or SNIR.

In general terms, beam information, such as information relating to the beamforming weights, can be transmitted between the RE and the REC as linear combinations of predetermined beams.

The UL OFDM FFT in FIG. 6 provides the output of Resource Elements for all antennas with $N_a$ antenna elements used for beamforming. The Resource Elements include either data or pre-known Reference Symbols.

By extracting the same Reference Symbol from all $N_a$ antennas elements and perform a transformation, e.g., a Discrete Fourier Transform (DFT), on the thus $N_a$ Reference Symbols, a transformation to a beam direction space from the antenna space is done. Each value in the $N_a$ long output from the transform provides information about the quality of the signal in one of the $N_a$ fixed beam directions.

All beamforming weight calculation can thereby be made in the beam direction space to minimize complexity. The beamforming weights can be determined based on the rank of the radio channel either for multiple users or a single user and be determined to limit the influence of UL interference as well as spreading of interference in the DL. This could be accomplished by combining enough of the discrete beam directions properly weighted to capture the majority of the energy that will result in a small throughput loss on network level.

The beamforming weights in the direction space (of size $N_d$) for beam b are given by:

$$w_d^b, d=i_0,i_1,\ldots,i_{N_d-1}$$

When applying the weights to either the UL or DL digital beamforming, they need to be transformed to the antenna space to handle the Resource Elements with data that also is in the antenna space.

The beamforming weights in the antenna space (of size $N_a$) for beam b are given by:

$$w_a^b, a=0,1,\ldots,N_a-1$$

If the transformation matrix used for performing the inverse transform (i.e. from the direction space to the antenna space) is denoted $F_{ad}$, then:

$$w_a^b=\Sigma_d F_{ad} w_d^b$$

The number of bits for $w_a^b$ per physical resource block (PRB) group and beam is $N_a B_{weight}$, whilst the number of bits for $w_d^b$ per PRB group and beam is $N_d B_{weight}$.

In order to reduce the load on the interface between the REC and the RE the beamforming weights can be transferred from the REC to the RE in the direction space. The number of beamforming weights $N_d$ in the direction space is smaller than the number of beamforming weights $N_a$ in the antenna space.

In addition to the beamforming weights in the direction space the indices $i_0, i_1, \ldots$ appointing which of the fixed beam directions to use are also transferred to the beamforming weight transformation block. The number of bits to transmit for the indices per PRB group and beam is $\leq N_d B_{ind}$.

The beam weight transformation block also include a hardware abstraction transformation function that hide the radio physical implementation and is capable to handle different configurations of number of antenna elements in the beamforming array antenna and other implementation aspects and states. In more detail, since most of the signal processing can be performed in the directional space, it will be possible to hide some hardware properties from the signal processing software. For example, this enables identical signal processing software to be used for different number of antennas but with the same number of used dimensions in the directional space.

Particular aspects of efficient compression of beamforming weights will now be disclosed in more detail.

Compression of the beamforming weights could be achieved by applying different encoding techniques to reduce the channel estimate in the UL direction and the beamforming weights in the DL direction. For example, the encoding techniques could be based on reducing the resolution of information in a transform domain, and/or sending differential information.

Figure 9:
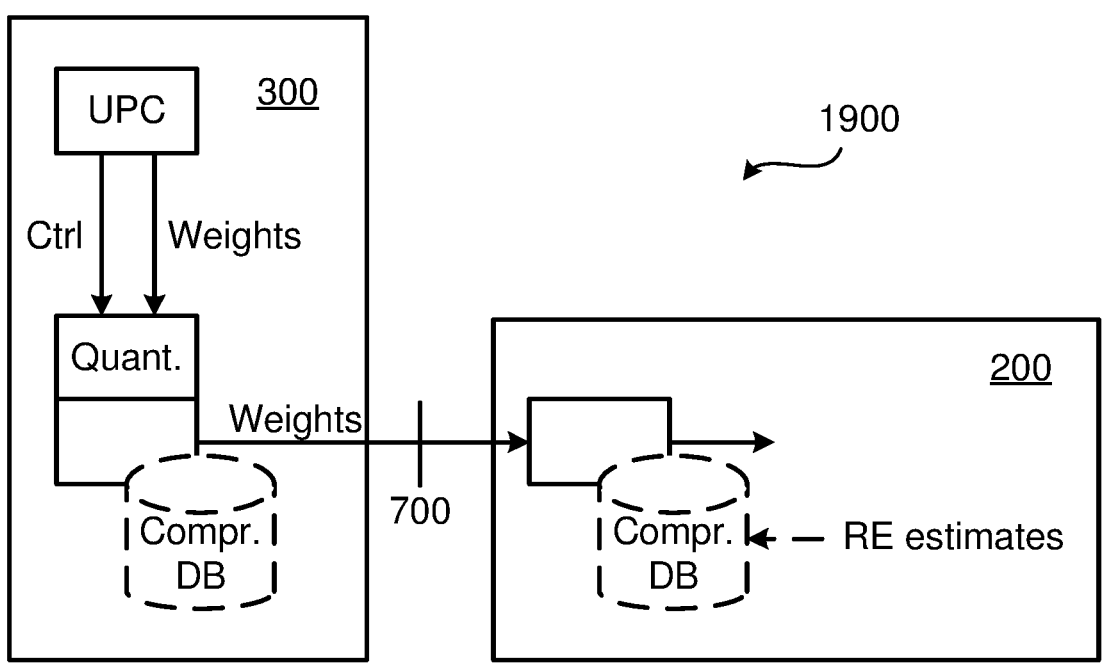
FIG. 9 is a schematic illustration of a compression subsystem according to an embodiment.

FIG. 9 shows a compression subsystem 1900 according to an embodiment where the interface 700 separates the REC 300 and the RE 200. The compression subsystem comprises a quantizer ("Quant.") placed in the REC and respective compression memories ("Compression DB" where DB is short for database) in the REC and RE. The compression subsystem could be controlled by the UPC in the REC. The use of beam direction space as disclosed above is optionally part of the compression subsystem.

An embodiment of the quantizer of the compression subsystem will now be disclosed. In general terms, the quantizer can apply reduction of word widths, have variable length lists of coefficients and/or apply other compression techniques. The beamforming weights are applied per OFDM symbol. A first reduction of the data is to use the same beamforming weights for a set of consecutive OFDM symbols (e.g., a set of consecutive subcarriers) in the time domain, typically for a complete transmission. A second reduction is to use the same beamforming weights for a set of consecutive OFDM symbols in the frequency domain. The REC could then inform which beamforming weights to use for each N subcarriers, and the RE could then perform interpolation for determining the beamforming weights of the subcarriers between these N subcarriers.

In some aspects the value of N is dependent on the channel coherence. Thus, the channel estimate can be processed in order for the REC to determine a value of N that is small enough to give sufficient beamforming performance. Each value of N will give a certain SNR performance, so the choice of N can be determined jointly with other related parameters in the link adaptation, such as output power and modulation and coding scheme (MCS).

An embodiment of the compression memories of the compression subsystem will now be disclosed. In order to reduce the load of the interface between the REC and the RE is for to the REC is to send differential information of the beamforming weights rather than a complete set of (quantized) beamforming weights to the RE. Two sources of base information on which the differential information can be based are previous transmissions of beamforming weights between the REC and the RE and beamforming weights determined internally in the RE. Previous transmissions of beamforming weights between the REC and the RE can either be from the last transmission (i.e., recent-most used beamforming weights), or as a continuous incremental refinement of beamforming weights. For continuous incremental refinement of beamforming weights, beamforming weights are first transmitted with a coarse resolution and then more refined, e.g. first using a large value N and then with incrementally smaller values of N. In terms of beamforming weights determined internally in the RE, the RE could be configured to determine the beamforming weights from its locally stored channel estimate. In the case that the REC is satisfied (e.g., the RE's assumption of single-user transmission is correct; one example where the REC is not satisfied is when it has received additional information (e.g. about interference) that it wants to use to create better beamforming weights) with the beamforming weights determined by the RE (e.g. as optimized for single-user operation), the REC can indicate this to the RE, thus requiring less signaling on the interface between the REC and the RE than if beamforming weight information is transmitted. This allows the REC to only send beamforming weights for terminal devices which beamforming weights have by the REC been modified (e.g. as optimized for multi-user operation).

An advantage of using the herein disclosed compression memories is that a communications system with stationary terminal devices will have very little signaling relating to the beamforming weights over the interface between the REC and the RE since such stationary terminal devices could use the same beamforming weights for two or more consecutive transmissions.

There are different ways of providing the differential information. Examples relating thereto will be provided next. A first example is to provide additive differential information whereby differential beamforming weights are added to the stored beamforming weights. A second example is to provide interpolating differential information whereby complementary beamforming weights, e.g. in frequency domain, are sent in order to improve the resolution (of beamforming weights having been sent with lower value of N) of the beamforming weights. A second example is to provide multiplicative differential information whereby sending a beam form to multiply the beamforming weights with in direction space. Assuming that the beamforming weights are represented as beamforming weight vectors, then each element of the beamforming weight vector corresponds to one direction. Setting one of those elements to zero (by multiply with zero) will create a beam pattern with a null in that direction. This can be very efficient to express a nulling, i.e. setting a restriction on a transmission.

The transmission of information over the interface between the REC and the RE in the UL generally is based on the same features as for the DL, but with information relating to channel estimates being transferred (instead of information relating to beamforming weights).

The (S)RS channel estimation function is configured to set a suitable value of N, and a suitable quantization. The UPC can, ahead of a measurement, state the maximum amount to data to send, not to overload the interface between the REC and the RE. One way is for the UPC in the REC to provide the RE with a value of N and where the RE then executes.

Particular aspects of efficient selection of UL beams will now be disclosed in more detail.

It can here be assumed that the UL beams are selected based on the channel state information. Selecting as a few beams as possible could reduce the bit rate on the interface between the REC and the RE. At the same time, more beams allow for more energy to be received and better suppression of interferers.

The more terminal devices that are scheduled together and the more angular spread of the beams needed to reach the terminal devices, the more beams need to be selected in order to reach good demodulation performance. Also the types of beams used (such as beam widths and energy per beam) will affect the number of beams needed. Beams with beamforming weights determined according to SVD (so-called SVD-beams) will require fewer selected beams than beams with beamforming weights determined according to a DFT (so-called DFT-beams) but could require more computational resources to compute. Hence there is a tradeoff between reduction of bitrate on the interface between the REC and the RE and processing complexity of the beam selection. DTF-beams imply that a fixed set of beams that evenly cover the whole spatial view seen from the RE is used. The DTF-beams can be spread out one-dimensionally (either spread out vertically or horizontally) or they can be spread out two-dimensionally (spread out both vertically and horizontally). DFT is one example of creating fixed beams. As understood by the person skilled in the art other methods for creating fixed beams, optionally including uneven spread of the beams, are equally applicable. SVD-beams imply that the set of beams are dynamically decided depending on the received signals from the desired terminal devices and optionally also dependent on received signals from the interfering terminal devices. As understood by the person skilled in the art other methods for creating dynamic beams are equally applicable.

The selection of beams can be based on channel estimates of reference symbol signals, or on channel estimates of demodulation reference signals (DMRS) embedded in an LTE physical uplink shared channel (PUSCH).

The selection of beams can be performed for each resource block, or for groups of resource blocks, or even with one common selection for the whole carrier bandwidth. The selection of beams can be performed with one single, common, selection for the whole carrier bandwidth, since the beams generally correspond to physical directions and even though the phase of the radio propagation is frequency dependent, the physical directions are not.

If multiple terminal devices are scheduled in the same resource blocks, and the RE is connected to one single REC, the selections can be made as the union of the beams needed for each terminal device. If, for example, three beams are selected for a first terminal device and three beams are selected for a second terminal device and one of the beams is common for the first terminal device and the second terminal device, then only five beams need to be transferred from the RE to the REC. If, on the other hand, the RE is connected to two RECs, and the first terminal device is handled by one REC and the second terminal device is handled by another REC, then three beams need to be sent to each REC.

According to some aspects the maximum number of beams that can be selected is controlled by the REC. The information about how many beams that can be selected are then provided by the REC to the RE over the interface. This information can be expressed in different ways. According to a first example the information specifies the maximum number of beams selected per terminal device. According to a second example the information specifies the maximum number of beams selected in total. According to a third example the information specifies a combined restriction of both the maximum number of beams selected per terminal device and the maximum number of beams selected in total. Given these limitations, the RE will decide how many beams that should be selected per terminal device. This can be done by the RE comparing the signal quality for the terminal devices in each of the beams, and select beams with the given limitations. In additions to the limitations given by the REC, the RE could also need to make the selection such that each terminal gets at least $M \geq 1$ number of beams selected.

Figure 14:
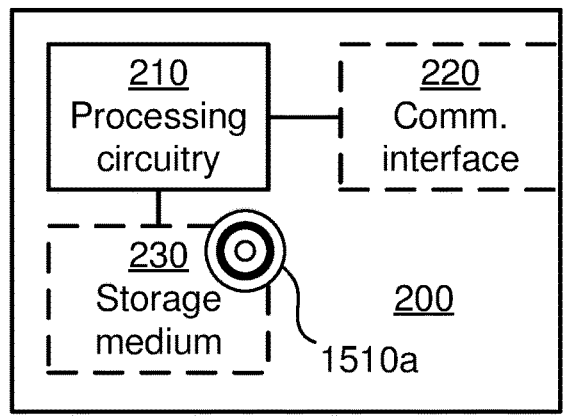
FIG. 14 is a schematic diagram showing functional units of an RE according to an embodiment.

FIG. 14 schematically illustrates, in terms of a number of functional units, the components of an RE according to an embodiment. Processing circuitry 210 is provided using any combination of one or more of a suitable central processing unit (CPU), multiprocessor, microcontroller, digital signal processor (DSP), etc., capable of executing software instructions stored in a computer program product 1810a (as in FIG. 18), e.g. in the form of a storage medium 230. The processing circuitry 210 may further be provided as at least one application specific integrated circuit (ASIC), or field programmable gate array (FPGA).

Particularly, the processing circuitry 210 is configured to cause the RE to perform a set of operations, or steps, S106-S116, S302-S306, S502-S506, as disclosed above. For example, the storage medium 230 may store the set of operations, and the processing circuitry 210 may be configured to retrieve the set of operations from the storage medium 230 to cause the RE to perform the set of operations. The set of operations may be provided as a set of executable instructions. Thus the processing circuitry 210 is thereby arranged to execute methods as herein disclosed.

The storage medium 230 may also comprise persistent storage, which, for example, can be any single one or combination of magnetic memory, optical memory, solid state memory or even remotely mounted memory.

The RE may further comprise a communications interface 220 for communications at least with the REC and the terminal devices. As such the communications interface 220 may comprise one or more transmitters and receivers, comprising analogue and digital components.

The processing circuitry 210 controls the general operation of the RE e.g. by sending data and control signals to the communications interface 220 and the storage medium 230, by receiving data and reports from the communications interface 220, and by retrieving data and instructions from the storage medium 230. Other components, as well as the related functionality, of the RE are omitted in order not to obscure the concepts presented herein.

Figure 15:
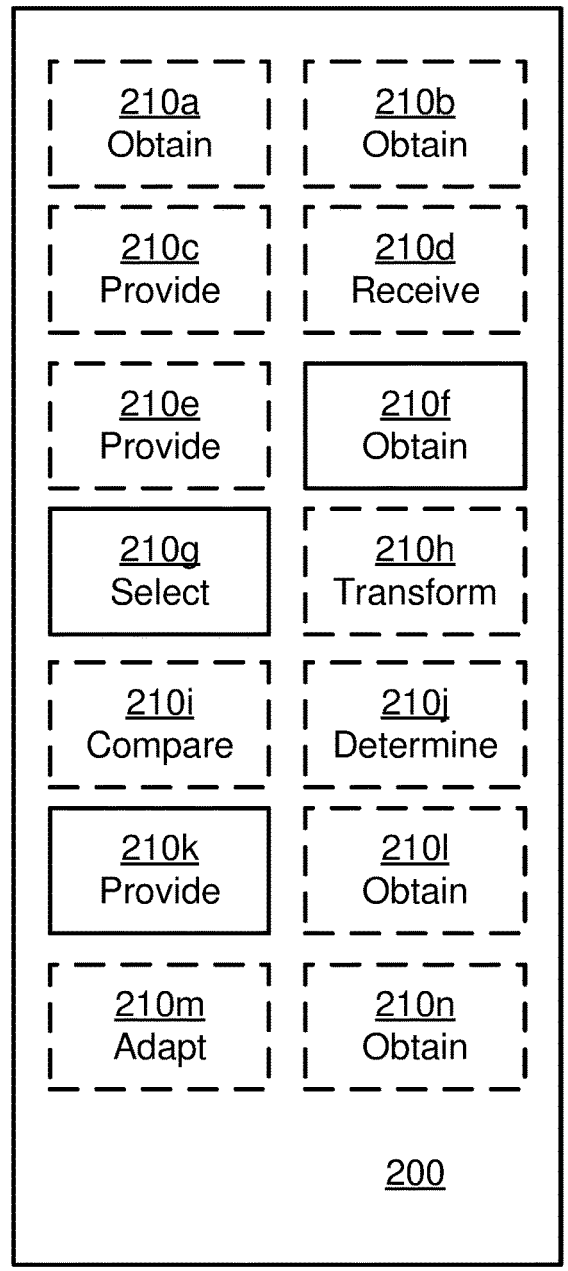
FIG. 15 is a schematic diagram showing functional modules of an RE according to an embodiment.

FIG. 15 schematically illustrates, in terms of a number of functional modules, the components of an RE according to an embodiment. The RE of FIG. 15 comprises a number of functional modules; at least an obtain module 210$f$ configured to perform step S106, a select module 210$g$ configured to perform step S108, and a provide module 210$k$ configured to perform step S110. The RE of FIG. 15 may further comprise a number of optional functional modules, such as any of an obtain module 210$a$ configured to perform step S102, an obtain module 210$b$ configured to perform step S102$a$, a provide module 210$c$ configured to perform step S102$b$, a receive module 210$d$ configured to perform step S102$c$, a provide module 210$e$ configured to perform step S104, a transform module 210$h$ configured to perform step S108$a$, a compare module 210$i$ configured to perform step S108$b$, a determine module 210$j$ configured to perform step S108$c$, an obtain module 210$l$ configured to perform step S112, an adapt module 210$m$ configured to perform step S114, and an obtain module 210$n$ configured to perform step S116.

In general terms, each functional module 210$a$-210$n$ may be implemented in hardware or in software. Preferably, one or more or all functional modules 210$a$-210$n$ may be implemented by the processing circuitry 210, possibly in cooperation with functional units 220 and/or 230. The processing circuitry 210 may thus be arranged to from the storage medium 230 fetch instructions as provided by a functional module 210$a$-210$n$ and to execute these instructions, thereby performing any steps of the RE as disclosed herein.

Figure 16:
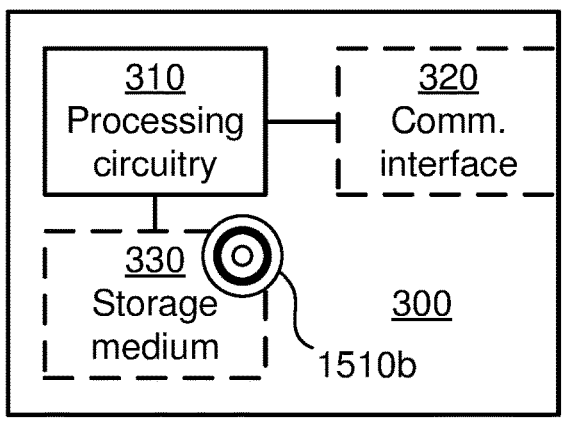
FIG. 16 is a schematic diagram showing functional units of an REC according to an embodiment.

FIG. 16 schematically illustrates, in terms of a number of functional units, the components of an REC according to an embodiment. Processing circuitry 310 is provided using any combination of one or more of a suitable central processing unit (CPU), multiprocessor, microcontroller, digital signal processor (DSP), etc., capable of executing software instructions stored in a computer program product 1810$b$ (as in FIG. 18), e.g. in the form of a storage medium 330. The processing circuitry 310 may further be provided as at least one application specific integrated circuit (ASIC), or field programmable gate array (FPGA).

Particularly, the processing circuitry 310 is configured to cause the REC to perform a set of operations, or steps, S202-S216, S402-S406, S602-S606, as disclosed above. For example, the storage medium 330 may store the set of operations, and the processing circuitry 310 may be configured to retrieve the set of operations from the storage medium 330 to cause the REC to perform the set of operations. The set of operations may be provided as a set of executable instructions. Thus the processing circuitry 310 is thereby arranged to execute methods as herein disclosed.

The storage medium 330 may also comprise persistent storage, which, for example, can be any single one or combination of magnetic memory, optical memory, solid state memory or even remotely mounted memory.

The REC may further comprise a communications interface 320 for communications at least with the RE. As such the communications interface 320 may comprise one or more transmitters and receivers, comprising analogue and digital components.

The processing circuitry 310 controls the general operation of the REC e.g. by sending data and control signals to the communications interface 320 and the storage medium 330, by receiving data and reports from the communications interface 320, and by retrieving data and instructions from the storage medium 330. Other components, as well as the related functionality, of the REC are omitted in order not to obscure the concepts presented herein.

Figure 17:
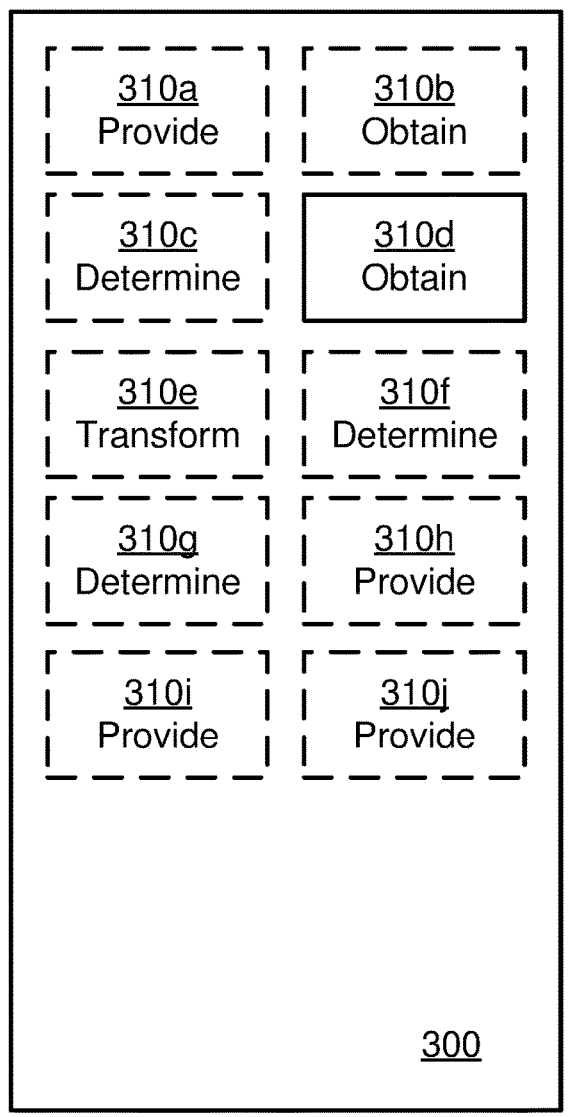
FIG. 17 is a schematic diagram showing functional modules of an REC according to an embodiment.

FIG. 17 schematically illustrates, in terms of a number of functional modules, the components of an REC according to an embodiment. The REC of FIG. 17 comprises an obtain module 310$d$ configured to perform step S204. The REC of FIG. 17 may further comprise a number of optional functional modules, such as any of a provide mode 310$a$ configured to performs step S202, an obtain mode 310$b$ configured to performs step S202$a$, a determine mode 310$c$ configured to performs step S202$b$, a transform mode 310$e$ configured to performs step S206, a determine mode 310$f$ configured to performs step S208, a determine mode 310$g$ configured to performs step S210, a provide mode 310$h$ configured to performs step S212, a provide mode 310$i$ configured to performs step S214, and a provide mode 310$j$ configured to performs step S216.

In general terms, each functional module 310$a$-310$j$ may be implemented in hardware or in software. Preferably, one or more or all functional modules 310$a$-310$j$ may be implemented by the processing circuitry 310, possibly in cooperation with functional units 320 and/or 330. The processing circuitry 310 may thus be arranged to from the storage medium 330 fetch instructions as provided by a functional module 310$a$-310$j$ and to execute these instructions, thereby performing any steps of the REC as disclosed herein.

The RE and REC may be provided as standalone devices or as a part of at least one further device. For example, as disclosed above the RE and REC may be provided in an access node. Alternatively, functionality of the RE and the REC may be distributed between at least two devices, or nodes.

Thus, a first portion of the instructions performed by the RE or REC may be executed in a first device, and a second portion of the of the instructions performed by the RE or REC may be executed in a second device; the herein disclosed embodiments are not limited to any particular number of devices on which the instructions performed by the RE or REC may be executed. Hence, the methods according to the herein disclosed embodiments are suitable to be performed by an RE or REC residing in a cloud computational environment. Therefore, although a single processing circuitry 210, 310 is illustrated in FIGS. 14 and 16 the processing circuitry 210, 310 may be distributed among a plurality of devices, or nodes. The same applies to the functional modules 210a-210n, 310a-310j of FIGS. 15 and 17 and the computer programs 1820a, 1820b of FIG. 18 (see below).

Figure 18:
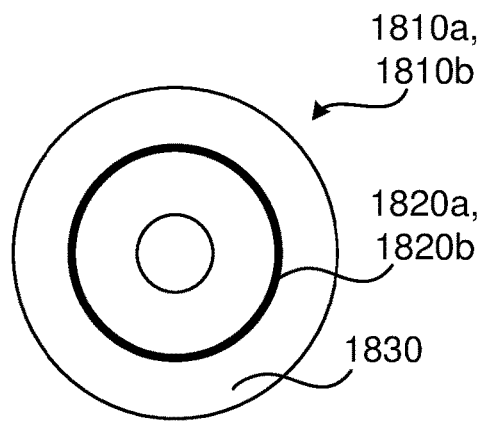
FIG. 18 shows one example of a computer program product comprising computer readable means according to an embodiment.

FIG. 18 shows one example of a computer program product 1810a, 1810b comprising computer readable means 1830. On this computer readable means 1830, a computer program 1820a can be stored, which computer program 1820a can cause the processing circuitry 210 and thereto operatively coupled entities and devices, such as the communications interface 220 and the storage medium 230, to execute methods according to embodiments described herein. The computer program 1820a and/or computer program product 1810a may thus provide means for performing any steps of the RE as herein disclosed. On this computer readable means 1830, a computer program 1820b can be stored, which computer program 1820b can cause the processing circuitry 310 and thereto operatively coupled entities and devices, such as the communications interface 320 and the storage medium 330, to execute methods according to embodiments described herein. The computer program 1820b and/or computer program product 1810b may thus provide means for performing any steps of the REC as herein disclosed.

In the example of FIG. 18, the computer program product 1810a, 1810b is illustrated as an optical disc, such as a CD (compact disc) or a DVD (digital versatile disc) or a Blu-Ray disc. The computer program product 1810a, 1810b could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1820a, 1820b is here schematically shown as a track on the depicted optical disk, the computer program 1820a, 1820b can be stored in any way which is suitable for the computer program product 1810a, 1810b.

The inventive concept has mainly been described above with reference to a few embodiments. However, as is readily appreciated by a person skilled in the art, other embodiments than the ones disclosed above are equally possible within the scope of the inventive concept, as defined by the appended claims. For example, although the embodiments mainly have been described in a time division duplex (TDD) context, at least some of the embodiments are also applicable for frequency division duplex (FDD). One difference in FDD compared to TDD is that the UL measurements cannot for sure be used for DL, due to the different frequencies UL and DL. In FDD the terminal device sends information about what beam direction the terminal device deems is best (from a raster of predetermined beams that the access node is repeatedly transmitting, i.e. a "code book"). In this case, the REC may need to provide beamforming weights to the RE (thus defining the external information).

What is claimed is:

1. A method performed by a radio equipment controller (REC), the method comprising:
   receiving feedback from a radio equipment (RE) that is remote from the REC and provides an air interface that is scheduled by the REC for downlink (DL) transmissions to and uplink (UL) transmissions from a terminal device served by the RE, the feedback being received over an interface coupling the RE to the REC and indicating quality values determined for the terminal device with respect to respective ones among a set of fixed beam directions; and
   determining beamforming weights in a directional space defined by the set of fixed beam directions; and
   transmitting information indicating the beamforming weights over the interface to the RE, for transformation at the RE from the directional space to an antenna space defined by an antenna array used at the RE for beamforming with respect to the terminal device.

2. The method of claim 1, wherein determining the beamforming weights in the directional space comprises determining a direction to use for the terminal device, based on the quality values, and realizing the determined direction as a linear combination of two or more fixed beam directions from the set of fixed beam directions, the beamforming weights defining the linear combination.

3. The method of claim 1, further comprising scheduling DL transmissions to and UL transmissions from the terminal device on the air interface, in dependence on the quality values.

4. The method of claim 3, wherein the terminal device is one among a plurality of terminal devices served by the RE, and wherein scheduling DL transmissions to and UL transmissions from the terminal device on the air interface comprises scheduling DL transmissions to and UL transmissions from individual ones of the plurality of terminal devices on the air interface, in dependence on quality values received from the RE via the interface for the individual ones of the plurality of terminal devices.

5. The method of claim 1, wherein the interface is a packet interface.

6. The method of claim 1, wherein, to provide downlink data to the RE for DL transmissions by the RE to the terminal device, the method further comprises sending unmodulated data bits over the interface to the RE, for modulation and mapping onto radio resources of the air interface by the RE.

7. A radio equipment controller (REC) comprising:
   interface circuitry configured to communicatively couple the REC to a radio equipment (RE) that is remote from the REC and provides an air interface that is scheduled by the REC for downlink (DL) transmissions to and uplink (UL) transmissions from a terminal device served by the RE;
   processing circuitry configured to:
      receive feedback from the RE via the interface circuitry, the feedback indicating quality values determined for the terminal device with respect to respective ones among a set of fixed beam directions;
      determine beamforming weights in a directional space defined by the set of fixed beam directions; and
      transmit information to the RE via the interface circuitry, the information indicating the beamforming weights, for transformation at the RE from the directional space to an antenna space defined by an antenna array used at the RE for beamforming with respect to the terminal device.

8. The REC of claim 7, wherein, to determine the beamforming weights in the directional space, the processing circuitry is configured to determine a direction to use for the terminal device, based on the quality values, and realize the determined direction as a linear combination of two or more fixed beam directions from the set of fixed beam directions, the beamforming weights defining the linear combination.

9. The REC of claim 7, wherein the processing circuitry is further configured to schedule DL transmissions to and UL transmissions from the terminal device on the air interface, in dependence on the quality values.

10. The REC of claim 9, wherein the terminal device is one among a plurality of terminal devices served by the RE, and wherein the processing circuitry is configured to schedule DL transmissions to and UL transmissions from the terminal device on the air interface by scheduling DL transmissions to and UL transmissions from individual ones of the plurality of terminal devices on the air interface, in dependence on quality values received from the RE for the individual ones of the plurality of terminal devices.

11. The REC of claim 7, wherein the interface circuitry is configured for packet-based communications with the RE.

12. The REC of claim 7, wherein, to provide downlink data to the RE for DL transmissions by the RE to the terminal device, the processing circuitry is configured to send unmodulated data bits via the interface circuitry to the RE, for modulation and mapping onto radio resources of the air interface by the RE.

13. A method performed by a radio equipment (RE), the method comprising:
- receiving beamforming weights from a Radio Equipment Controller (REC) that is remote from the RE, the beamforming weights received via an interface between the RE and the REC and corresponding to respective beam directions in a defined set of fixed beam directions;
- transforming the beamforming weights into an antenna space defined by an antenna array of the RE, the transformed beamforming weights being weight values corresponding to respective elements of the antenna array; and
- performing a beamformed transmission according to the transformed beamforming weights.

\* \* \* \* \*